(12) United States Patent
Shu et al.

(10) Patent No.: US 12,199,691 B2
(45) Date of Patent: Jan. 14, 2025

(54) WAVEGUIDE COMPONENT FOR HIGH FREQUENCY TESTING

(71) Applicant: SAGE Millimeter, Inc., Torrance, CA (US)

(72) Inventors: Yonghui Shu, Rolling Hills Estates, CA (US); Cornelius Moseti Mayaka, San Jose, CA (US); Dhanraj Vikram Doshi, Torrance, CA (US)

(73) Assignee: SAGE Millimeter, Inc., Torrance, CA (US)

( * ) Notice: Subject to any disclaimer, the term of this patent is extended or adjusted under 35 U.S.C. 154(b) by 0 days.

(21) Appl. No.: 18/444,425

(22) Filed: Feb. 16, 2024

(65) Prior Publication Data
US 2024/0348286 A1    Oct. 17, 2024

Related U.S. Application Data

(63) Continuation of application No. 17/307,512, filed on May 4, 2021, now abandoned.

(51) Int. Cl.
| | |
|---|---|
| *H04B 3/46* | (2015.01) |
| *G01R 1/02* | (2006.01) |
| *G01R 1/04* | (2006.01) |
| *G01R 1/067* | (2006.01) |
| *G01R 1/073* | (2006.01) |
| *G01R 27/28* | (2006.01) |
| *G01R 31/26* | (2020.01) |
| *G01R 31/28* | (2006.01) |
| *H01P 1/04* | (2006.01) |
| *H01P 3/12* | (2006.01) |
| *H01P 5/02* | (2006.01) |

(52) U.S. Cl.
CPC ........... *H04B 3/46* (2013.01); *G01R 1/06772* (2013.01); *H01P 3/12* (2013.01)

(58) Field of Classification Search
CPC ..... H04B 3/46; H01P 3/12; H01P 5/02; H01P 1/04; H01P 1/06; G01R 1/02; G01R 1/04; G01R 1/067; G01R 1/073; G01R 1/20; G01R 31/26; G01R 31/28; G01R 27/28
See application file for complete search history.

(56) References Cited

U.S. PATENT DOCUMENTS

| 11,289,787 B2 | 3/2022 | Yang |
| 2018/0113187 A1 | 4/2018 | Vassilev |

(Continued)

FOREIGN PATENT DOCUMENTS

| CN | 216145755 | 3/2022 |
| EP | 3453070 | 4/2022 |

OTHER PUBLICATIONS

A.R. Kerr, "Mismatch caused by waveguide tolerances, corner radii, and flange misalignment," Nat. Radio Astronomy Observatory, Charlottesville, VA, USA, Tech. Rep. Electronics. Dec. 7, 2009.

(Continued)

*Primary Examiner* — Neel D Shah
(74) *Attorney, Agent, or Firm* — Van Pelt, Yi & James LLP

(57) ABSTRACT

A waveguide interface is disclosed. The disclosed waveguide interface comprises: an inner boundary region extending peripherally around a cavity, a recessed region extending peripherally around the inner boundary region, and a plurality of protrusions extending from the recessed region.

25 Claims, 17 Drawing Sheets

(56) References Cited

U.S. PATENT DOCUMENTS

2019/0123411 A1\* 4/2019 Carlred .................. H01P 1/042
2021/0159577 A1 5/2021 Carlred

OTHER PUBLICATIONS

A.R. Kerr, Division Technical Note No. 215, 2010. Available: https://library.nrao.edu/public/memos/edtn/EDTN_215.pdf.

Alfonso et al., "Contactless Flange Adapters for Mm-Wave Measurements", 2017 11th European Conference on Antennas and Propagation (EUCAP), 2017.

Dongquan Sun and Jinping Xu. "Real Time Rotatable Waveguide Twist Using Contactless Stacked Air-Gapped Waveguides," Microw. Wirel. Compon. Lett. vol. 27, No. 3, pp. 215-217, Mar. 2017.

Dongquan Sun, Zhenhua Chen, and Jinping Xu. "Flexible rectangular waveguide based on cylindrical contactless flange," Electron Lett., vol. 52, No. 25, pp. 2042-2044, Dec. 2016.

E. Pucci and P.-S. Kildal, "Contactless non-leaking waveguide flange realized by bed of nails for millimeter wave applications," in Proc. 6th Eur. Conf. Antennas Propag. (EUCAP_, May 2012, pp. 3533-3536.

E. Rajo-Iglesias and P.-S. Kildal, "Numerical studies of bandwidth of parallel-plate cut-off realised by a bed of nails, corrugations and mushroom-type electromagnetic bandgap for use in gap waveguides," 2011.

H. Li, A. Arsenovic, J. L. Hesler, A. R. Kerr, and R. M. Weikle, "Repeatability and mismatch of waveguide flanges in the 500-750 GHz band," IEEE Trans. Terahertz Sci. Technol., vol. 4, No. 1, pp. 39-48, Jan. 2014.

P.-S. Kildal, "Three metamaterial-based gap waveguides between parallel metal plates for mm/submm waves", 3rd European Conference on Antennas and Propagation, 2009. EuCAP 2009. Berlin, Germany, 2327 Mar. 2009.

P.-S. Kildal, E. Alfonso, A. Valero-Nogueira, and E. Rajo-Iglesias, "Local metamaterial-based waveguides in gaps between parallel metal plates," IEEE Antennas Wireless Propag. Lett., vol. 8, pp. 84-87 Apr. 2009.

R. Naruse, H. Saito, J. Hirokawa, and M. Zhang, "Non-contact wavefeed with choke-flange waveguide at the development section of the expansion antenna for small satellite," IEICE, Tokyo, Japan, vol. 114, No. 194, pp. 77-82, Tech. Rep. SANE 2014-61, Aug. 2014.

Xiang Chen et al., "Low Passive-Intermodulation Contactless Waveguide Adapter Based on Gap Waveguide Technology," 13th Eur. Antennas Propagation Conf., 2019.

\* cited by examiner

WAVEGUIDE COMPONENT FOR HIGH FREQUENCY TESTING

CROSS REFERENCE TO OTHER APPLICATIONS

This application is a continuation of U.S. patent application Ser. No. 17/307,512, entitled WAVEGUIDE COMPONENT FOR HIGH FREQUENCY TESTING filed May 4, 2021 which is incorporated herein by reference for all purposes.

BACKGROUND OF THE INVENTION

Radio-Frequency (RF) engineering involves the design and testing of devices that produce or utilize signals within the radio band, a frequency range that extends from approximately 20 kilohertz (kHz) up to 300 gigahertz (GHz). In RF engineering, waveguides are structures (typically hollow conductive pipes) that are utilized to guide and transmit electromagnetic waves with minimal loss of energy by restricting the transmission of energy to one direction. Waveguide flanges, which are also utilized in RF engineering, are connectors for joining waveguide sections. Waveguide flanges have many uses, including connecting RF devices under test (DUTs) to RF testing equipment. In many scenarios, attaching a waveguide flange to a DUT involves cumbersome and time-consuming physical manipulation. This can result in measurements that are inconsistent and difficult to reproduce. Thus, it would be beneficial to develop techniques directed toward improving connection of waveguide sections.

BRIEF DESCRIPTION OF THE DRAWINGS

Various embodiments of the invention are disclosed in the following detailed description and the accompanying drawings.

FIG. 2b is a diagram depicting a zoomed in view of a portion of the embodiment of the waveguide component shown in FIG. 2a.

FIG. 2c is a diagram illustrating an example of a pin structure in some embodiments of the waveguide component shown in FIG. 2a.

FIG. 2d is a diagram depicting various views of the embodiment of the waveguide component shown in FIG. 2a.

DETAILED DESCRIPTION

Figure 1:
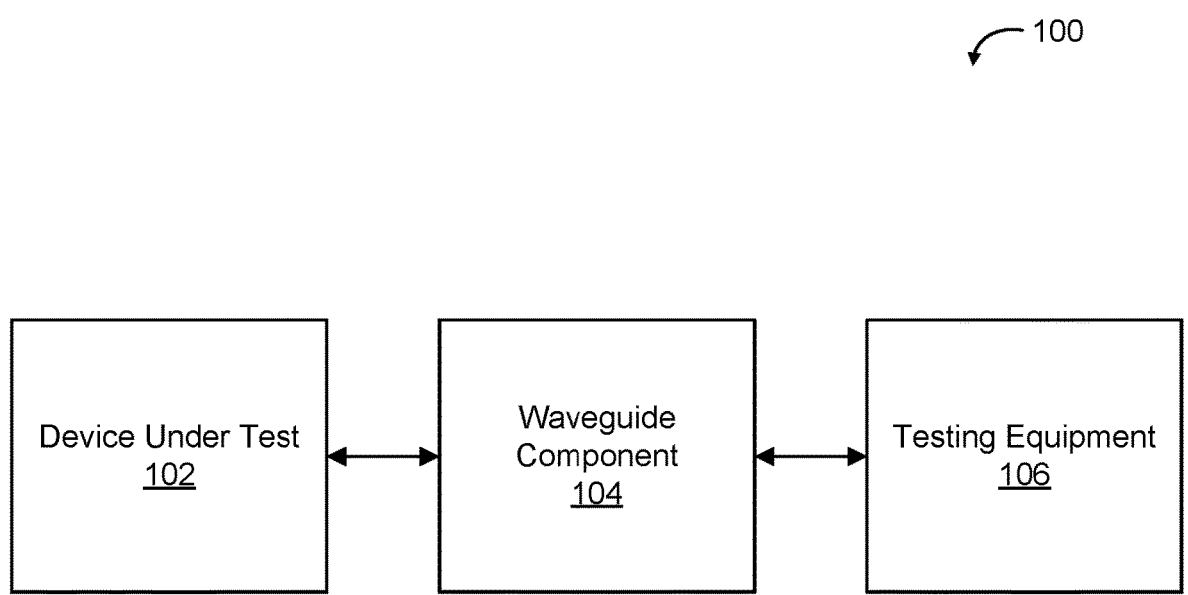
FIG. 1 is a block diagram illustrating an embodiment of a system for performing high frequency testing.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

A waveguide interface is disclosed. The disclosed waveguide interface comprises: an inner boundary region extending peripherally around a cavity, a recessed region extending peripherally around the inner boundary region, and a plurality of protrusions extending from the recessed region. The disclosed waveguide interface is a part of a disclosed waveguide component. A practical and technological advantage of the disclosed waveguide component over conventional waveguide components used in high frequency device testing is that the disclosed waveguide component can be used to perform faster measurements because fastening devices under test (DUT), e.g., with screws, is not required. Good electromagnetic wave transmission can be maintained to minimize leakage and losses that degrade circuit performance without tightly and carefully fastening the disclosed waveguide component to a DUT. Avoiding time consuming fastening, especially when performing repeated measurements on multi-port devices, facilitates rapid and high-throughput measurement of RF devices. The disclosed waveguide component allows for fast, accurate, and reliable measurements at millimeter-wave (mmW) and terahertz (THz) frequencies.

Conventional waveguide connections are realized using fastening or clamping hardware. The quality and consistency of connections can have a large impact on measurement results and data accuracy, particularly when the required frequency reaches mmW and THz ranges. Additionally, frequently attaching and detaching waveguides degrades quality and performance of the waveguide interfaces and slows down testing, which can be detrimental in areas where accuracy and speed are both critical. The disclosed waveguide component overcomes these limitations and drawbacks and allows reliable and repeatable waveguide connections without physical contact (e.g., secured by fastening and clamping hardware) being necessary. In some embodiments, the disclosed waveguide component is incorporated into a mmW or THz test setup, for example with vector network analyzer (VNA) extenders. In such a setup, connections are made simply and easily. This improves waveguide test setup life span, connection accuracy, reduces calibration uncertainty, and helps reduce testing time significantly. The disclosed waveguide component can eliminate the mechanical stress needed to physically connect a waveguide flange and avoid or reduce measurement errors and uncertainties due to misalignment. This is particularly important at higher frequencies from V band (50 GHZ) and up and through the THz frequency range. When implemented in test setups, such as VNA extender test systems, additional benefits include reduction of connection and alignment time, elimination of wear and tear, and overall improved measurement accuracy.

Waveguide components refer to devices associated with the design, manufacturing, testing, and/or utilization of waveguides. There are many types of waveguide components. Examples of waveguide components include waveguides, various types of waveguide connection/attachment components, waveguide amplifiers/attenuators, various other physical apparatuses that attach to waveguide sections, and various other mechanical and/or electrical components. In many scenarios, waveguide sections need to be coupled using a waveguide component. As used herein, these coupling waveguide components may be referred to as waveguide connectors, waveguide couplers, waveguide transitions, waveguide flanges, waveguide straights, waveguide bends, waveguide twists, or other terms. In various embodiments, a waveguide component is utilized to couple microwave frequency testing equipment to a DUT. As used herein with respect to the disclosed waveguide component, the terms "couple", "coupling", "connect", "connecting", "connection", and so forth refer to guiding and transmitting electromagnetic waves from a first waveguide section (e.g., a waveguide section of testing equipment) to a second waveguide section (e.g., a waveguide section of a DUT). These terms do not imply a physical connection. For example, the disclosed waveguide component is not necessarily in physical contact with the first and/or second waveguide sections (e.g., not necessarily in physical contact with the testing equipment and/or the DUT). Electromagnetic waves can be guided and transmitted from testing equipment to a device under test via a waveguide component without the waveguide component being in physical contact with the testing equipment and/or the device under test. In this context, the waveguide component still couples/connects the testing equipment to the device under test even without physical contact. Stated alternatively, coupling/connecting can refer to maintaining transmission of electromagnetic waves.

Waveguides are commonly used transmission media in modern microwave and millimeter wave components, subassemblies, and systems. As used herein, microwave refers to an electromagnetic frequency range that extends from approximately 300 MHz up to 30 GHZ, and millimeter wave from approximately 30 GHz to 300 GHz. As used herein, RF includes these frequency ranges. The disclosed waveguide component may also be utilized in the terahertz regions, which is typically defined as 0.3 to 30 THz. As used herein, a waveguide refers to a structure (e.g., a hollow conductive metal pipe) that guides and transmits electromagnetic waves with minimal loss of energy by restricting the transmission of energy to one direction. As used herein, high frequency testing includes testing and measuring of components at microwave and millimeter wave frequency ranges as well as in the terahertz frequency range.

FIG. 1 is a block diagram illustrating an embodiment of a system for performing high frequency testing. In system 100, device under test 102 is connected by waveguide component 104 to testing equipment 106. Examples of device under test 102 include antennas, amplifiers, frequency converters, switches, attenuators, filters, oscillators, or any other type of component for which testing is desired. In various embodiments, testing includes measurement of device gain and/or loss and return loss as a function of frequency or characterization of other device electronic properties. Examples of properties that may be measured include S-parameters, Y-parameters, Z-parameters, H-parameters, various types of gains/losses and return losses associated with microwave frequency and other devices, and so forth. In various embodiments, device under test 102 includes a waveguide section configured to allow high frequency signals to be received from other waveguide sections with minimal loss of energy. Stated alternatively, in various embodiments, device under test 102 includes a waveguide port as an interface to waveguide component 104. The waveguide section of device under test 102 can be of various types. Examples of waveguide types include rectangular waveguides, circular waveguides, elliptical waveguides, single-ridge waveguides, double-ridge waveguides, or any other type of waveguide.

Conventionally, measuring high frequency waveguide-based systems necessitates the physical interconnection of components commonly through the usage of standard waveguide flanges and screws. A problem with high-frequency devices is that there is a strict mechanical requirement on good electrical contact between waveguide flanges and therefore the waveguide flanges must be tightly connected to each other to avoid mechanically induced interface mismatch. Gaps between the mating flanges lead to power leakage and poor return loss causing unreliable and inaccurate measurements. Additionally, frequently attaching and detaching the waveguides degrades quality and performance of the interfaces of the waveguide component and DUT and slows down testing, which can be detrimental in areas where speed is a priority. Thus, conventionally, a waveguide flange is oftentimes used to connect device under test 102 to testing equipment 106, thus requiring precise physical contact. As described in further detail herein, the disclosed waveguide component does not require physical contact. Thus, the disclosed waveguide component may be referred to as a contactless waveguide flange.

In various embodiments, waveguide component 104 includes a waveguide section to match the waveguide section of device under test 102. For example, waveguide component 104 may include a rectangular waveguide to interface with a rectangular waveguide of device under test 102. Stated alternatively, in various embodiments, a waveguide port of waveguide component 104 interfaces with a waveguide port of device under test 102. In various embodiments, waveguide component 104 also includes another waveguide port on an opposite end to interface with testing equipment 106. In various embodiments, testing equipment 106 transmits measurement signals via a waveguide. In high frequency testing scenarios, waveguides are utilized in the entire signal transmission pathway from testing equipment 106 to device under test 102 to minimize energy loss. As described in further detail herein (e.g., see FIG. 2), in various embodiments, waveguide component 104 includes a body, wherein the body includes an interface configured to face toward a waveguide opening (e.g., waveguide opening of a device under test), and a cavity within the body (e.g., hollow portion of a waveguide), wherein an end of the cavity terminates at the interface. In various embodiments, the interface includes an inner boundary surface surrounding the end of the cavity, a plurality of elements (e.g., pin-like structures) in a concentric arrangement surrounding the inner boundary surface, and an outer boundary surface surrounding the plurality of elements. The interface can also include holes for alignment pins and mounting screws. Mounting holes for screws to fasten to device under test 102 are not strictly necessary because, in various embodiments, waveguide component 104 can operate without being in physical contact with device under test 102. Alignment pins are also not strictly necessary because, as described in further detail herein, automated alignment may be utilized to align a device under test with waveguide component 104.

In some embodiments, testing equipment 106 includes a network analyzer or a portion of a network analyzer. A network analyzer refers to an instrument that measures network parameters of microwave, millimeter wave, or THz networks. A common type of network analyzer is a vector network analyzer (VNA). In some embodiments, waveguide component 104 is physically attached to an extender component of a network analyzer. In this configuration, waveguide module 104 is physically fastened (e.g., using screws) to the microwave, millimeter wave, or THz extender component (e.g., a VNA extender). As described in further detail herein, in various embodiments, testing equipment 106 also includes a rail along which waveguide component 104 can slide to interface with device under test 102. The block diagram shown in FIG. 1 illustrate logical connections between device under test 102, waveguide component 104, and testing equipment 106. In various physical implementations, device under test 102 is connected to two instances of waveguide component 104 on opposing ends of device under test 102. Furthermore, in various embodiments, testing equipment 106 comprises a testing setup that includes multiple extender components of a network analyzer and a rail system that may be automated.

Figure 2A:
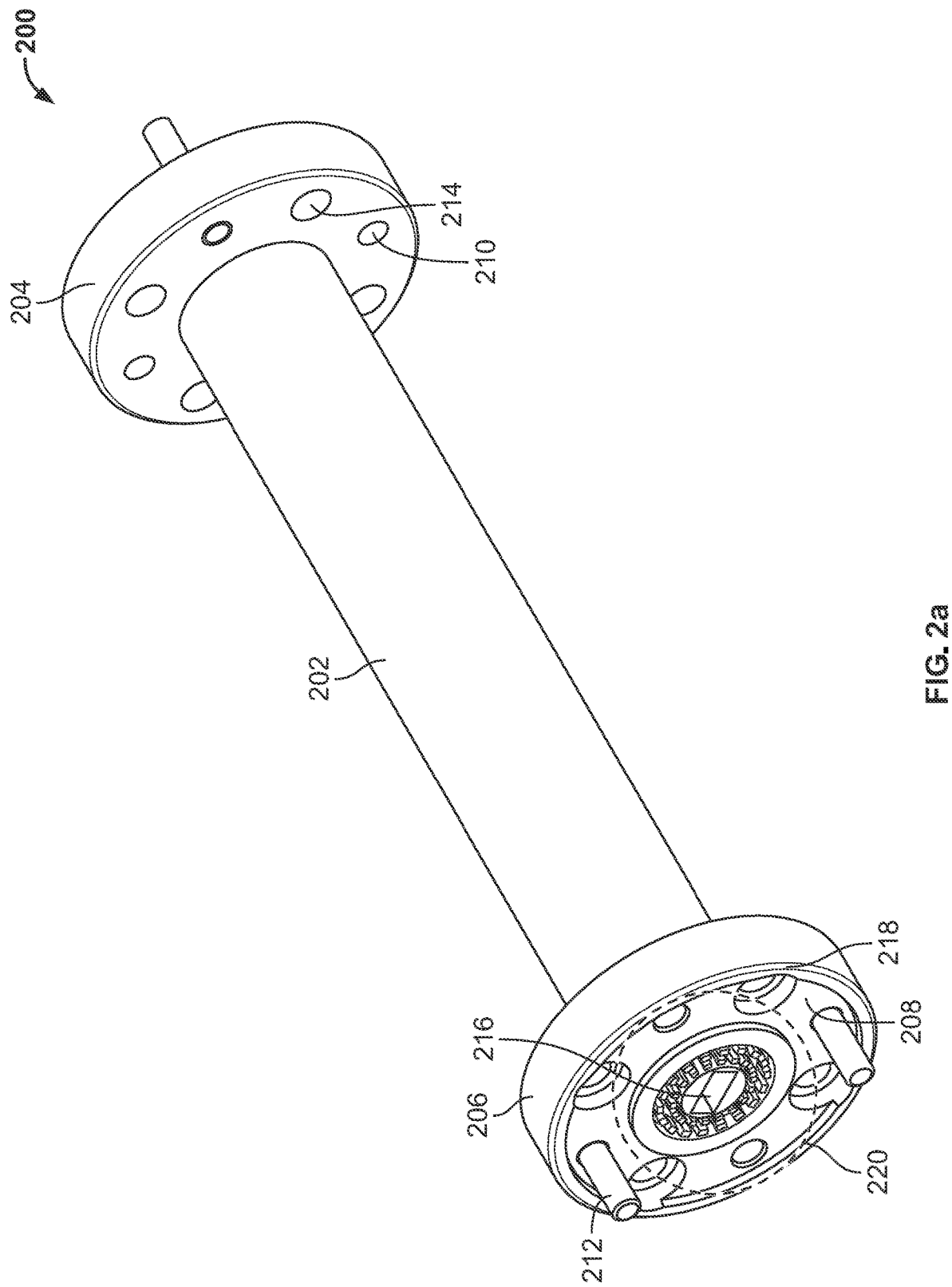
FIG. 2a is a diagram illustrating an embodiment of a waveguide component for coupling testing equipment to a device under test.

FIG. 2a is a diagram illustrating an embodiment of a waveguide component for coupling testing equipment to a device under test. In some embodiments, waveguide component 200 is waveguide component 104 of FIG. 1. In the example illustrated, waveguide component 200 includes body 202 and ends 204 and 206. Body 202 includes a waveguide extending from end 204 to end 206. The waveguide comprises cavity 216, which extends from end 204 to end 206. The waveguide also comprises at least a thin layer of a conductive material surrounding cavity 216 that guides electromagnetic waves. In some embodiments, the conductive material is a copper alloy (e.g., beryllium copper). It is also possible to utilize brass, silver, aluminum, or other metals with low bulk resistivity. In some embodiments, ends 204 and 206 are constructed at least in part with brass. Other metals are also possible. In some embodiments, the exterior of body 202 and ends 204 and 206 are plated with gold.

In the example illustrated, each end includes a face with various features. Face 208 is the face of end 206. Face 208 functions as an interface configured to face toward a waveguide opening of another component. Thus, face 208 or a portion thereof may also be referred to as a waveguide interface. For example, face 208 can face toward a DUT and the face of end 204 can face toward testing equipment. Thus, waveguide component 200 can be utilized to connect a DUT (e.g., device under test 102 of FIG. 1) and testing equipment (e.g., testing equipment 106 of FIG. 1). Face 208 also includes an end of cavity 216. Cavity 216 terminates at one end at face 208. In the example illustrated, ends 204 and 206 include two sets of holes on each face. Specifically, in the example shown, four smaller holes, an example of which is hole 210, and four larger holes, an example of which is hole 214, are located on each face.

Alignment pins, an example of which is alignment pin 212, may be inserted into the smaller holes. Alignment pins may be utilized to aid in placing waveguide component 200 in a reproducible position with respect to DUTs and testing equipment as DUTs are swapped in and out. Alignment pins, and the smaller holes as well, are not strictly required for operation of waveguide component 200. For example, alignment pins on face 208 may not be required when utilizing an automated (e.g., motorized) positioning system that precisely and reproducibly positions waveguide component 200 next to a DUT. Alignment pins, though, may still be useful to aid with alignment even with an automated positioning system (e.g., to confirm proper alignment). Alignment pins may also prevent a DUT from falling if no other component (e.g., a DUT holder) is used to hold up the DUT and no other component of waveguide 200 is in physical contact with the DUT (e.g., no use of mounting screws).

Mounting screws (also referred to as fastening screws) may be threaded through the larger holes (e.g., hole 214) to fasten waveguide component 200 to a DUT and/or testing equipment. Mounting screws, and thus holes for mounting screws, are also not strictly required on face 208 because waveguide component 200 does not need to be physically touching a DUT. Not using mounting screws on face 208 has the advantage of avoiding cumbersome and time-consuming physical manipulation to fasten and unfasten waveguide component 200 to DUTs. Mounting screws may be necessary on the end facing testing equipment in order to fasten waveguide 200 to testing equipment. Oftentimes, there is no disadvantage to using mounting screws on the end facing testing equipment because waveguide component 200 rarely needs to be detached from testing equipment when testing DUTs. Also shown in the example illustrated is anti-cocking ring 218 to prevent cocking when fastening waveguide component 200 to a DUT with mounting screws. Cocking refers to tilting/turning of one waveguide component with respect to another waveguide component, resulting in a gap between the waveguide components, caused by tightening of mounting screws used to fasten the two waveguide components together. Anti-cocking ring 218 on face 208 is not strictly required, particularly when no mounting screws are used. By eliminating the need for screws, measurements on DUTs can be performed faster because only alignment (e.g., with alignment pins or using other techniques) is required.

In some embodiments, holes for alignment pins and mounting screws are included on both faces even if alignment pins and/or mounting screws are not necessary to connect to a DUT. An advantage of doing so is to preserve symmetry so that both ends can be used interchangeably to connect to testing equipment that may require alignment pins and/or mounting screws. Preserving symmetry can also make manufacturing of waveguide component 200 simpler and more reproducible. Holes for alignment pins and/or mounting screws may also be included to conform to waveguide flange standards. Mounting screws may be included on both faces to allow for physical connection and fastening if desired. In some embodiments, end 204 is identical to end 206. In the example shown, face 208 also has various other features, including an inner boundary surface surrounding the end of cavity 216, a plurality of pin-like elements in a concentric arrangement surrounding the inner boundary surface, and an outer boundary surface surrounding the plurality of pin-like elements, that are shown in region 220 (indicated with dashed lines). A zoomed-in view of region 220 is shown in FIG. 2b and the above features in region 220 are described below.

Figure 2B:
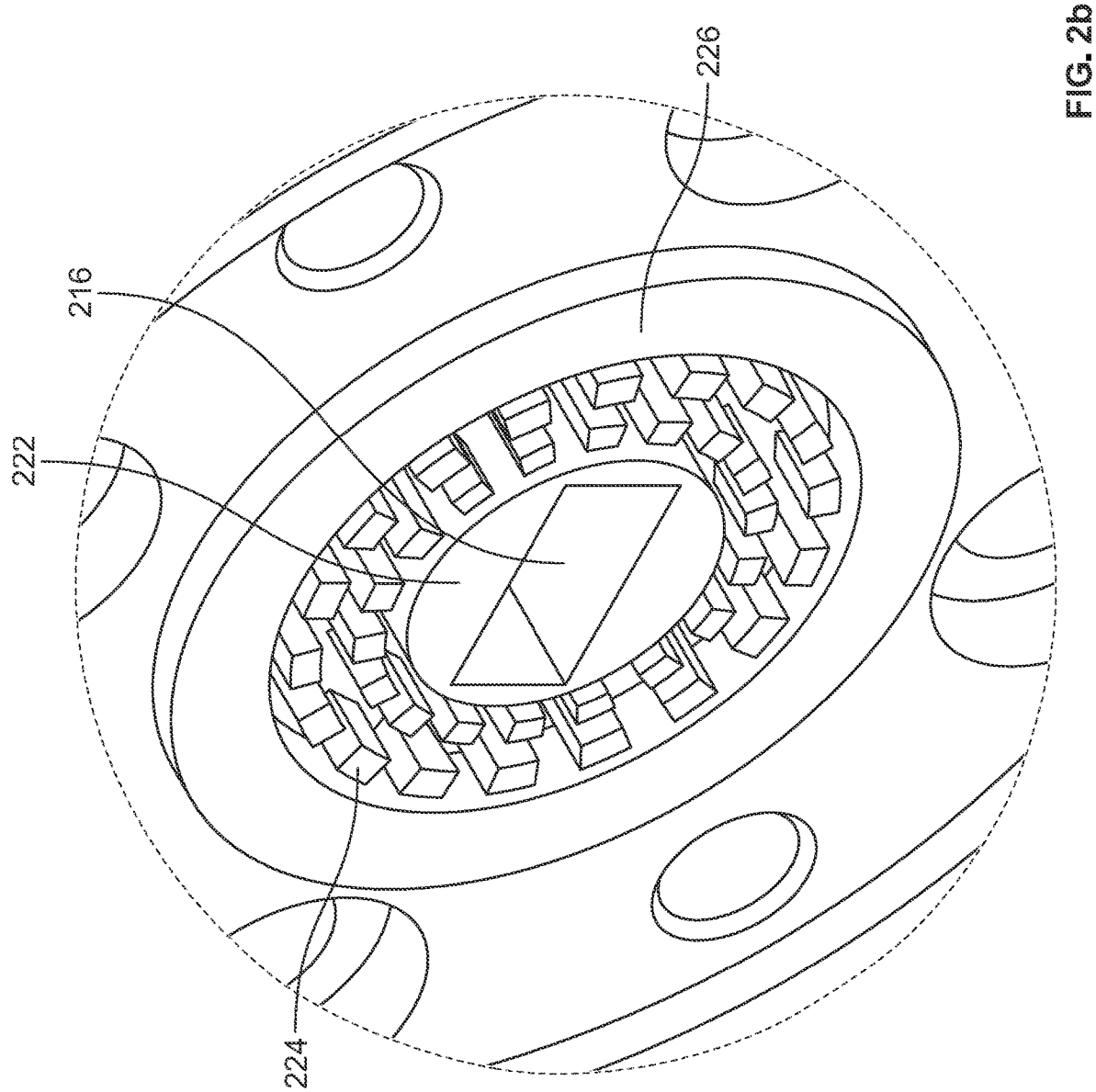

FIG. 2b is a diagram depicting a zoomed in view of a portion of the embodiment of the waveguide component shown in FIG. 2a. FIG. 2b shows a zoomed-in view of region 220 from FIG. 2a. FIG. 2b shows a portion of face 208 of FIG. 2a. In the example illustrated, inner boundary surface 222 surrounds cavity 216, two rings of pin-like elements (an example of which is pin 224) surround inner boundary surface 222, and outer boundary surface 226 surrounds the rings of pin-like elements. In the example illustrated, inner boundary surface 222 is an inner boundary region that extends peripherally around cavity 216, the pin-like elements occupy a recessed region extending peripherally around the inner boundary region, the pin-like elements are protrusions extending from the recessed region, and outer boundary surface 222 is an outer boundary region that extends peripherally around the recessed region. The pin-like elements can also be described as pin-shaped, column-like, column-shaped, rectangular column-shaped, etc. In some embodiments, the components shown (the boundary surfaces and the pin/column elements) are fabricated with computer numerical control (CNC) milling. For example, a CNC machine can cut and excavate three concentric grooves in an area of face 108 surrounding cavity 216. This defines and forms inner boundary surface 222 around cavity 216. Then, the CNC machine can cut and excavate radially outward from inner boundary surface 222 to outer boundary surface 226. This defines and forms two rings of pin-like structures as shown in FIG. 2b. With this form of manufacturing (cutting radially outward), the pins in the outer ring and the pins in the inner ring will be slightly different sizes. This difference decreases as the number of pins increases. It is also possible to create equal-sized pins by programming the CNC machine with instructions to create equal-sized pins.

In various embodiments, the end of cavity 216, inner boundary surface 222, each pin-like element/structure (including pin 224), and outer boundary surface 226 are substantially level with one another. These elements can be considered substantially level with one another if they are not offset with respect to one another by more than 20% of the height of the pin-like elements. Thus, if a DUT facing face 208 of waveguide component 200 is physically in contact with face 208, the DUT would be flush with the end of cavity 216, inner boundary surface 222, each pin-like element/structure (including pin 224), and outer boundary surface 226. Furthermore, if there is a gap between the DUT and face 208, the gap distance from the DUT to the end of cavity 216, inner boundary surface 222, each pin-like element/structure (including pin 224), and outer boundary surface 226 would be the same distance. The end of cavity 216, inner boundary surface 222, each pin-like element/structure (including pin 224), and outer boundary surface 226 can also be substantially level with face 208. These elements can be considered substantially level with face 208 if they are not offset with respect to face 208 by more than 20% of the height of the pin-like elements. Shapes other than pin/column shapes may also be utilized. In general, it is possible to use various shaped repeating, discrete elements with gaps between elements to populate the space between inner boundary surface area 222 and outer boundary surface area 226. The effect of the number of elements (e.g., pins) and the number of rings of those elements on electromagnetic performance can be simulated using electromagnetic simulation tools, such as HFSS (High Frequency Structure Simulator) and CST (Computer Simulation Technology). An additional consideration for the number of elements (e.g., pins) is manufacturing case and strength of the elements. Typically, fewer elements result in stronger elements that are easier to manufacture. In the example shown, there are two rings of 18 pin-like elements. Other arrangements are also possible (e.g., 14, 15, 16 elements per ring, three rings of elements, etc.). The number of rings can vary from three to five or more depending on the available space on face 208. Increasing the number of rings improves return loss. However, in many scenarios, increasing the number of rings also increases manufacturing cost.

Example thicknesses for inner boundary surface 222 and outer boundary surface 226 are as follows: 14 mil (1 mil=1 thousandth of an inch) thickness for the short walls of inner boundary surface 222, wherein the short walls correspond to the shorter dimension of cavity 216, 45 mil thickness for the long walls of inner boundary surface 222, wherein the long walls correspond to the longer dimension of cavity 216, and 47 mil thickness for outer boundary surface 226. A consideration for the thickness of outer boundary surface 226 is selecting a large enough thickness to protect the surfaces of the pin-like elements from contact damage. The protection is proportional to the ratio of surface area of non-pin element surface area to pin element surface area.

In various embodiments, the depth of the grooves defining the pin-like elements is selected to be close to $$\frac{\lambda_g}{4}$$

where $\lambda_g$ is a guided wavelength corresponding to the waveguide comprised of cavity 216 operating at a desired center frequency. Stated alternatively, in various embodiments, each groove depth is approximately a quarter of the guided wavelength at the desired operating frequency. In various embodiments, waveguide component 200 is configured to operate in a range of frequencies centered at a desired center frequency. The range of frequencies spans at least several GHz and can span several tens of GHz or more. The guided wavelength $\lambda_g$ is different from (longer than) the corresponding wavelength in air, which is referred to as $\lambda_0$. The selection of the groove depth to be $$\frac{\lambda_g}{4}$$

is in accordance with choke flange theoretical principles. Each groove can be referred to as a choke ring. In various embodiments, a choke ring is also selected approximately to be a distance of $$\frac{\lambda_g}{4}$$

from cavity 216 along the longer dimension of cavity 216. Stated alternatively, in various embodiments, the thickness of the long walls of inner boundary surface 222 are selected to be approximately $$\frac{\lambda_g}{4}.$$

The short walls are thinner, which is associated with increased operational bandwidth.

The surface of a DUT and the surface of the disclosed waveguide component facing the DUT can be considered similar to two parallel metal plates. The example illustrated is in accordance with gap waveguide theoretical principles in which, if a perfect magnetic conductor (PMC) plate and a perfect electric conductor (PEC) plate are placed such that they are parallel to each other and the distance between the two plates is less than $$\frac{\lambda_0}{4}$$

where $\lambda_0$ is the wavelength of the operating frequency in air), a cut-off condition is created and no parallel plate modes will propagate between the plates. The pin surface in the example illustrated forms a high impedance surface that creates a parallel-plate cut-off to reduce loss and reflection. For design and simulation purposes, the plurality of pin-like elements can be considered an array of repeating unit elements, an example of which is shown in FIG. 2c.

Figure 2C:
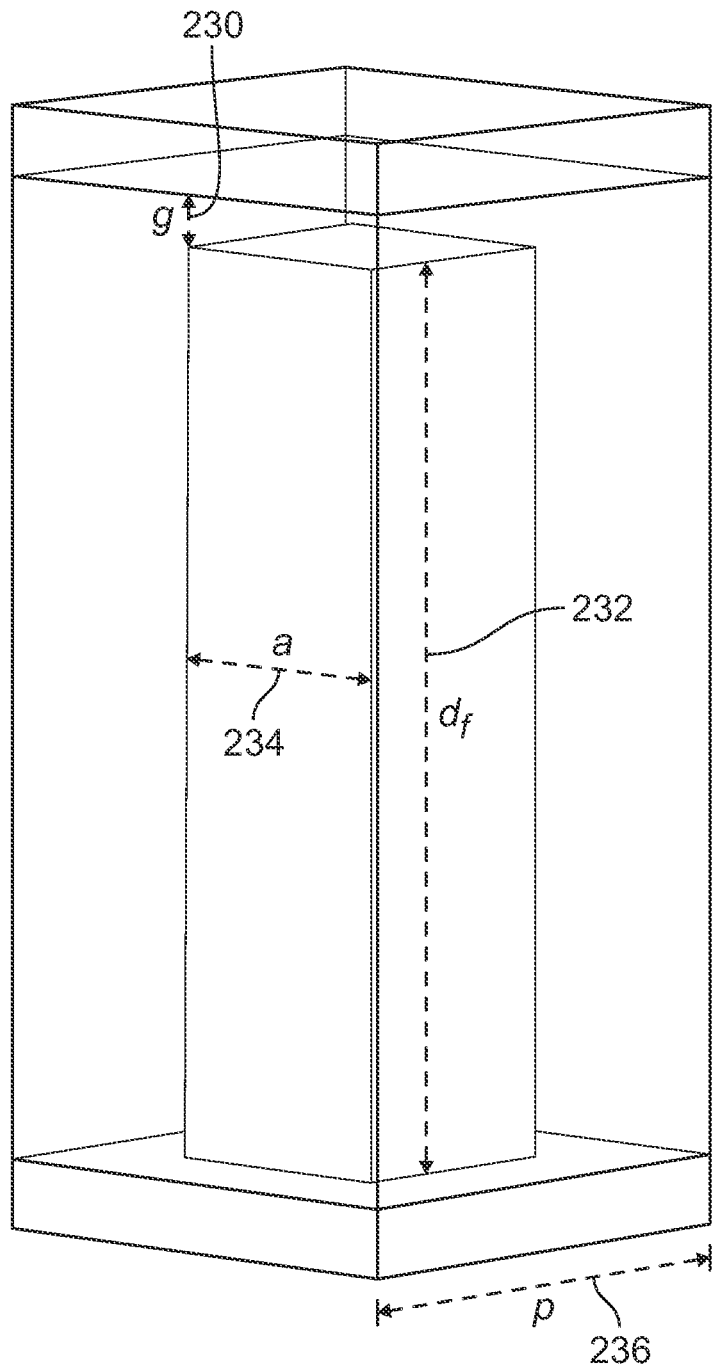

FIG. 2c is a diagram illustrating an example of a pin structure in some embodiments of the waveguide component shown in FIG. 2a. The example illustrated has the following parameters: gap (g) 230, height ($d_f$) 232, width (a) 234, and pitch (p) 236. Example dimensions at an approximate center frequency of 75 GHz are as follows: g=3 mils, $d_f$=35 mils, a=15 mils, p=25 mils. Gap g corresponds to the distance between the pin structure and a DUT during contactless operation. In accordance with gap waveguide theoretical principles, gap g should be kept less than $$\frac{\lambda_0}{4}.$$

Decreasing gap g typically improves performance (e.g., increases operating bandwidth). When gap g=0, a waveguide component comprised of a plurality of pin-like structures is in physical contact with the DUT. Pitch p corresponds to distance between pins. The distance between pins as well as pin width affect stopband performance. In various embodiments, the width of the pin is selected to be less than $$\frac{\lambda_0}{8}$$

and the pitch less than $$\frac{\lambda_0}{4}.$$

The smaller the width and the pitch the better the performance. Stopband performance is also affected by pin height (stopband moves to lower frequencies as pin height increases) and gap g. The effects of modifying various parameters can be determined using electromagnetic simulation tools, such as HFSS and CST. Waveguide component 200 operates effectively when it is not in contact with the DUT and at a distance of less than $$\frac{\lambda_0}{4}$$

from the DUT. Waveguide component 200 also operates effectively when the distance is zero. Stated alternatively, waveguide component 200 also operates effectively when it is in physical contact with the DUT and/or testing equipment. This property of operating effectively whether or not there is physical contact is a technological advantage of waveguide component 200. It solves the problem of unstable and inaccurate measurements caused by loose connections that result in intermittent physical contact. The disclosed waveguide component may be utilized in various frequency bands (e.g., WR-42, WR-28, WR-22, WR-19, WR-15, WR-12, WR-10, WR-08, WR-06, and WR-05 covering frequencies from 18 to 220 GHZ). It can also be utilized in other bands as well because the structures disclosed herein are not limiting to any specific frequency band. For different frequency bands, various parameters of waveguide component 200 can be adjusted to optimize performance. For example, the arrangement and sizes of the pin-like elements can be adjusted and designed using electromagnetic simulation tools.

Figure 2D:
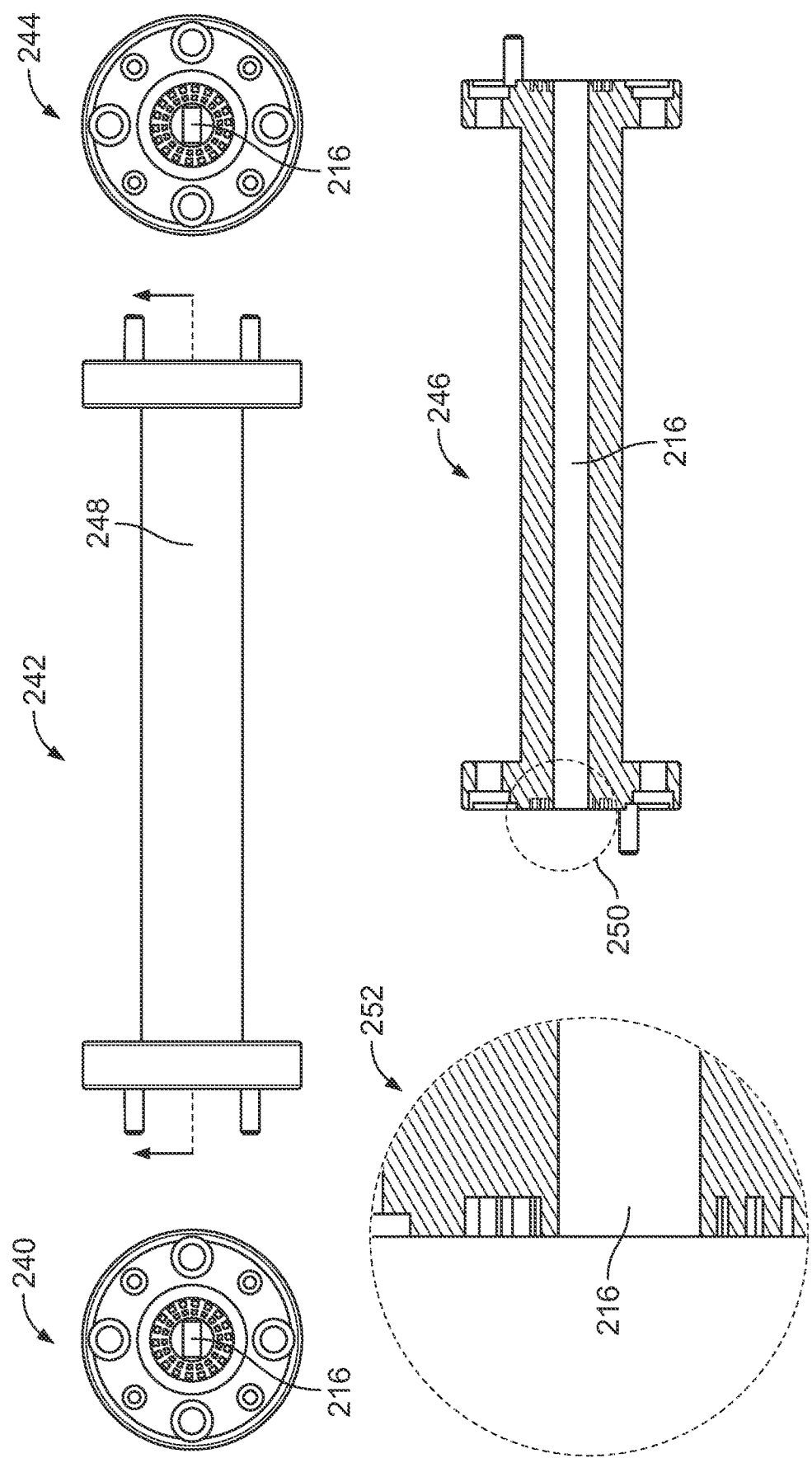

FIG. 2d is a diagram depicting various views of the embodiment of the waveguide component shown in FIG. 2a. View 240 shows a first face and end. View 242 is a side view. View 244 shows the other face and end. View 246 is a view of cross section 248 in view 242. View 252 is a zoomed-in view of region 250 in view 246. Cavity 216 from FIGS. 2a-2b is visible in views 240, 244, 246, and 252 and is labelled. In views 240 and 244, various features surrounding cavity 216 (including boundary surfaces, two concentric rings of elements, alignment holes, and mounting holes) are also visible. Alignment pins are visible in view 242. Cavity 216 extending from one end of the waveguide component to the other is apparent in view 246.

Figure 3A:
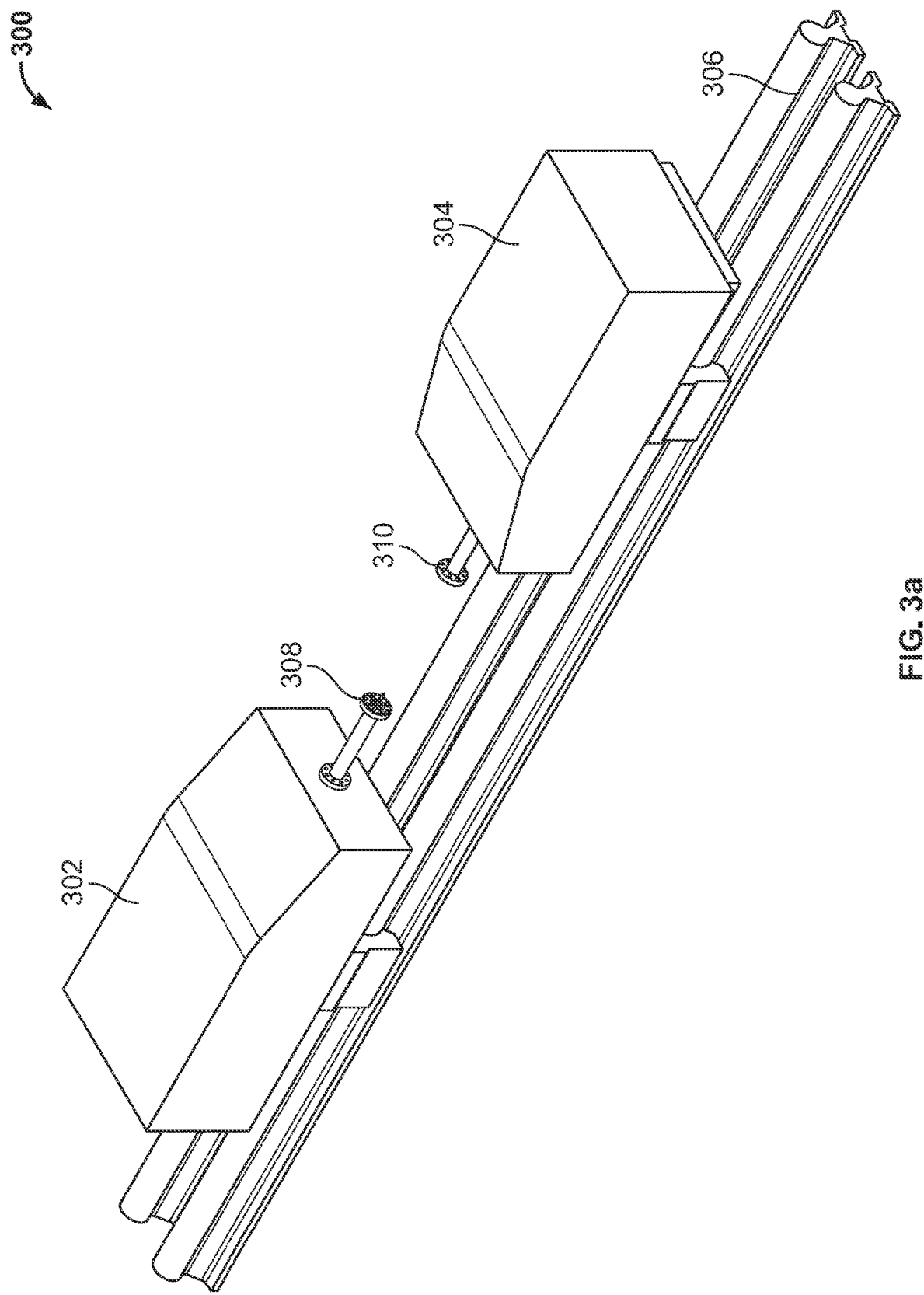
FIGS. 3a-3d are diagrams depicting various views of an embodiment of a system incorporating waveguide components configured for rapid high frequency testing.

FIGS. 3a-3d are diagrams depicting various views of an embodiment of a system incorporating waveguide components configured for rapid high frequency testing. As shown in FIG. 3a, in system 300, millimeter wave VNA extenders are mounted and slide along rail 306. The VNA extenders can also be microwave, THz, etc. VNA extenders. As used herein, VNA extenders can refer to any type of network analyzer component in any frequency range (e.g., microwave, millimeter wave, THz, and so forth). Waveguide components 308 and 310 are attached to VNA extenders 302 and 304, respectively. In some embodiments, waveguide component 308 and/or waveguide component 310 is waveguide component 104 of FIG. 1. In some embodiments, waveguide component 308 and/or waveguide component 310 is waveguide component 200 of FIG. 2a. In various embodiments, a DUT is placed between waveguide components 308 and 310. In some embodiments, the DUT is device under test 102 of FIG. 1. In various embodiments, the DUT does not need to be in physical contact with any part of the components shown in FIG. 3a. This is because waveguide components 308 and 310 can have good electrical contact with the DUT without being in physical contact. The DUT may be held in an apparatus (not shown) (e.g., suspended in between waveguide components 308 and 310) so that the DUT can be swapped in and held and waveguide components 308 and 310 are able to be slid against the DUT. In some embodiments, the DUT is held up by alignment pins of waveguide components 308 and 310.

To test a DUT when physical contact is required involves many manual adjustments (with screws, etc.) to align conventional waveguide components with the DUT, which is time-consuming. Another problem is that measurements change (are not stable) when the testing setup is moved. When physical contact is required, a gap between a waveguide connector and the DUT alters measurement results. Mounting screws also scratch the DUT and measurements change over time due to wear and tear on the screws altering the testing setup. The waveguide component disclosed herein addresses these problems. The waveguide component can be utilized in one of the testing setups disclosed herein (e.g., system 300) for high-throughput testing.

System 300 is an embodiment of a testing setup in which DUTs are manually placed. As described in further detail below, in other embodiments, the testing setup is fully automated. In an automated setup, the lengths of waveguide components can be made shorter because no working distance for human hands to manually position a DUT is needed. In the example shown, using a rail allows for faster measurements as the waveguide components can be quickly slid in and out.

Figure 3B:
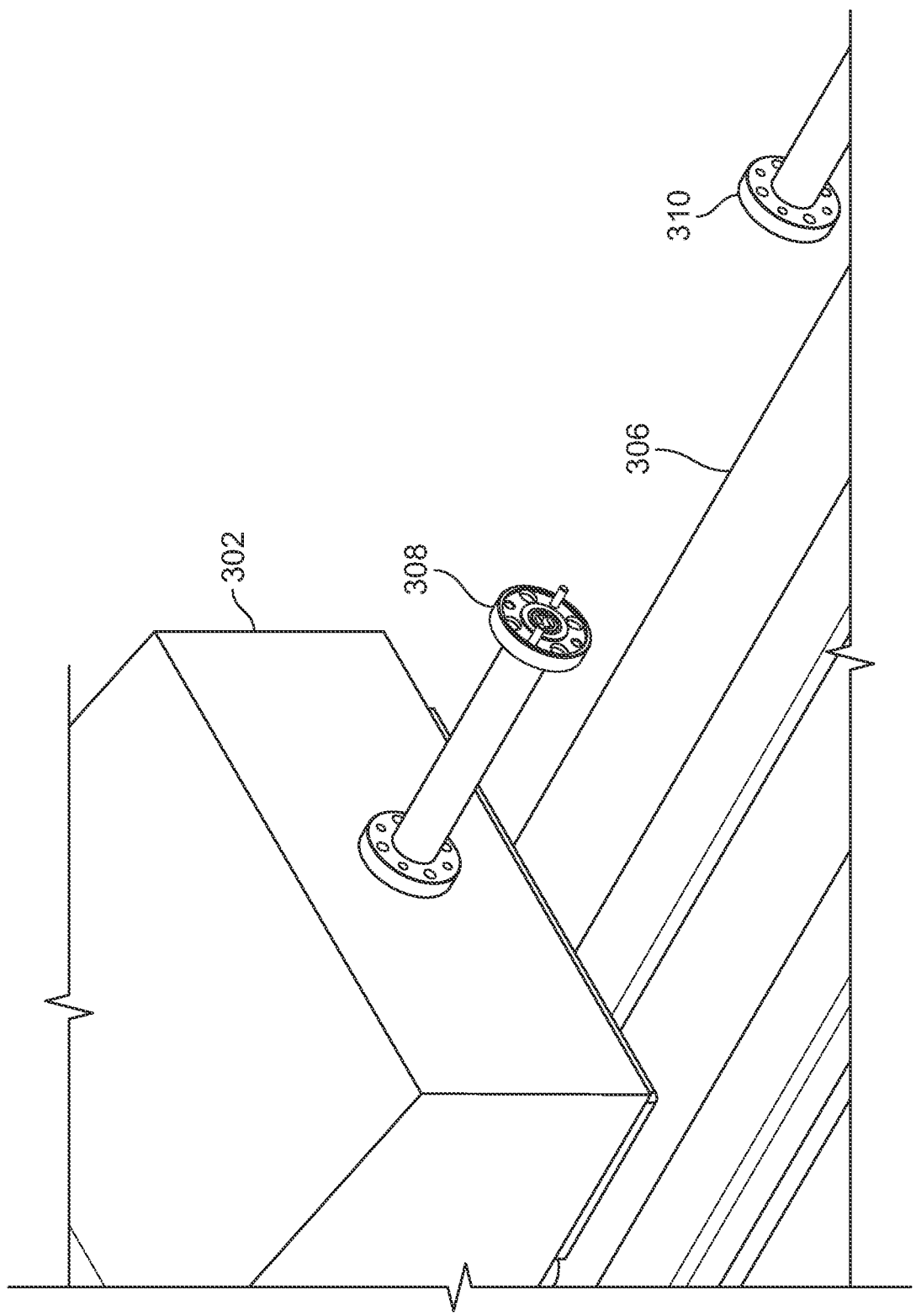
Figure 3C:
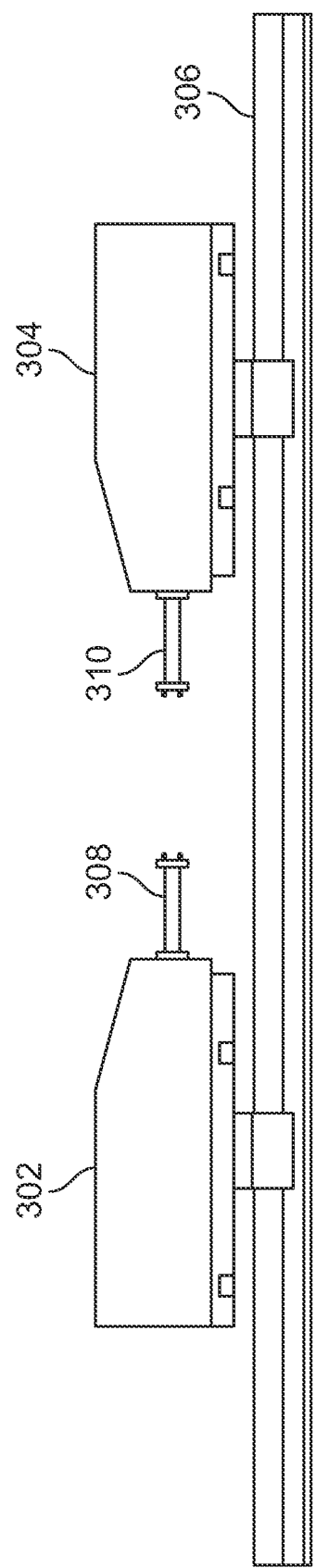
Figure 3D:
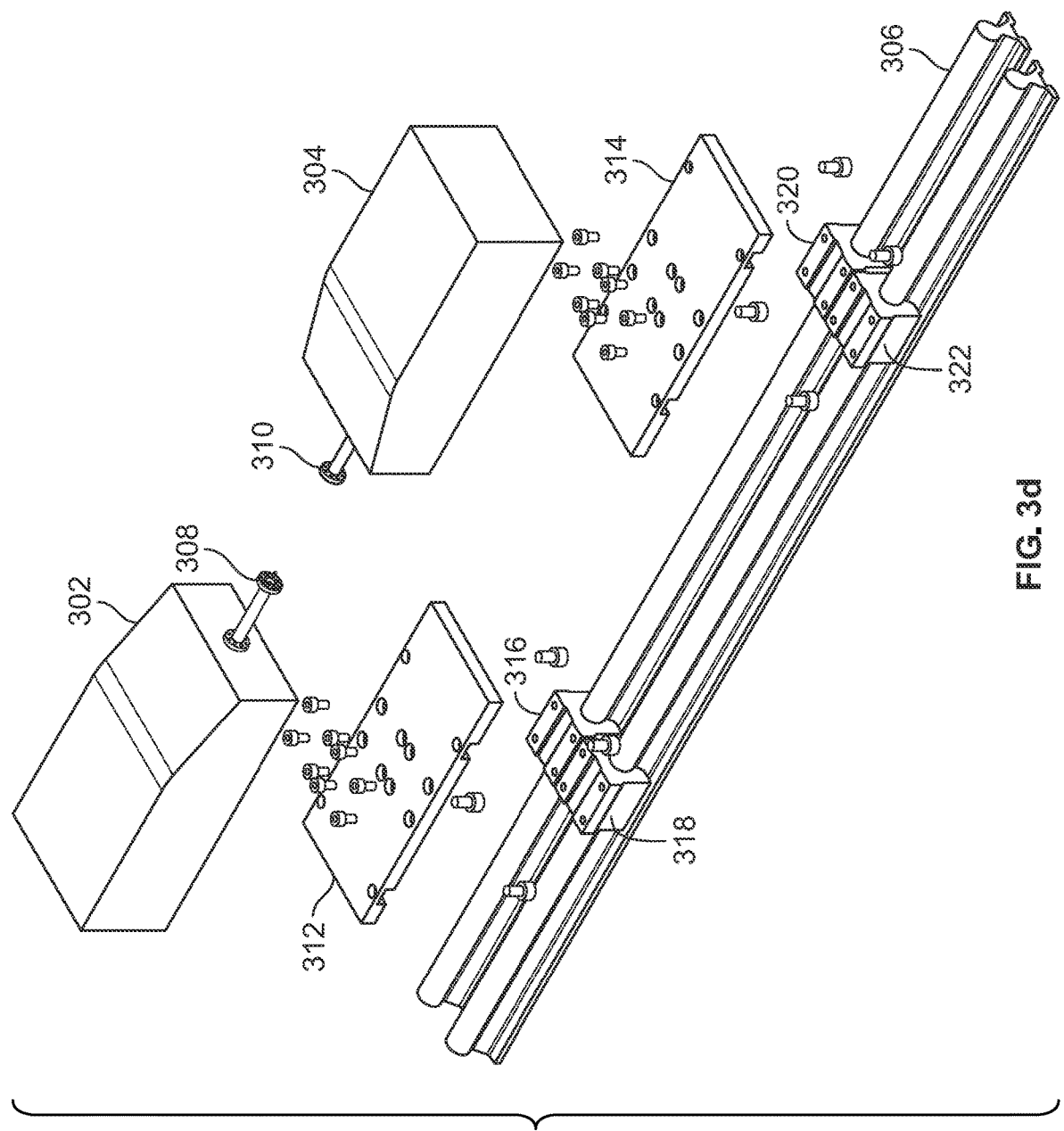

FIG. 3b shows a zoomed-in view of system 300. In the view of FIG. 3b, VNA extender 302, rail 306, and waveguide components 308 and 310 are visible. The face of waveguide component 308 is visible. FIG. 3c shows a side view of system 300. In the view of FIG. 3c, VNA extenders 302 and 304, rail 306, and waveguide component 308 and 310 are visible. FIG. 3d shows an exploded view of system 300. In the view of FIG. 3d, VNA extenders 302 and 304, rail 306, and waveguide component 308 and 310 are once again visible. Furthermore, the example shown illustrates fastening of VNA extenders 302 and 304 to mounting plates 312 and 314, respectively, with screws. In the example shown, mounting plate 312 is fastened to sliders 316 and 318 with screws. In the example shown, mounting plate 314 is fastened to sliders 320 and 322 with screws. In the example shown, rail 306 comprises two tracks along which sliders 316, 318, 320, and 322 are able to move. Thus, in the example shown, rail 306 comprises two tracks along which VNA extenders 302 and 304 (attached to sliders via mounting plates) can slide back and forth (using sliders 316 and 320 for a first track and sliders 318 and 322 for a second track). As used herein, a rail can include one or more tracks. A rail with a single track may be referred to as just a track. A single track may also be referred to as a rail. A plurality of tracks may be referred to as a rail system.

Figure 4A:
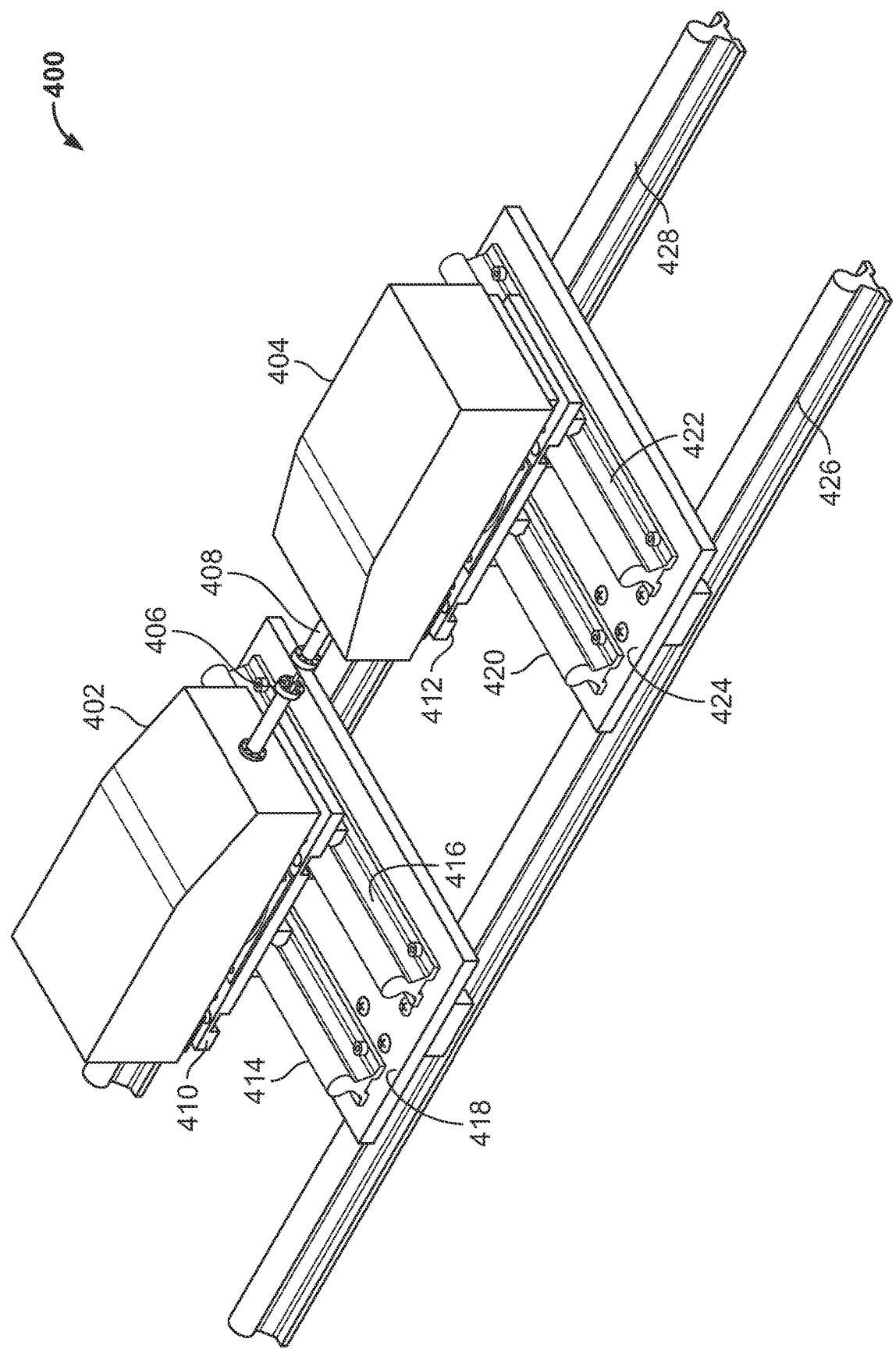
FIGS. 4a-4b are diagrams depicting various views of an embodiment of a system with multi-axis movement capability incorporating waveguide components configured for rapid high frequency testing.
Figure 4B:
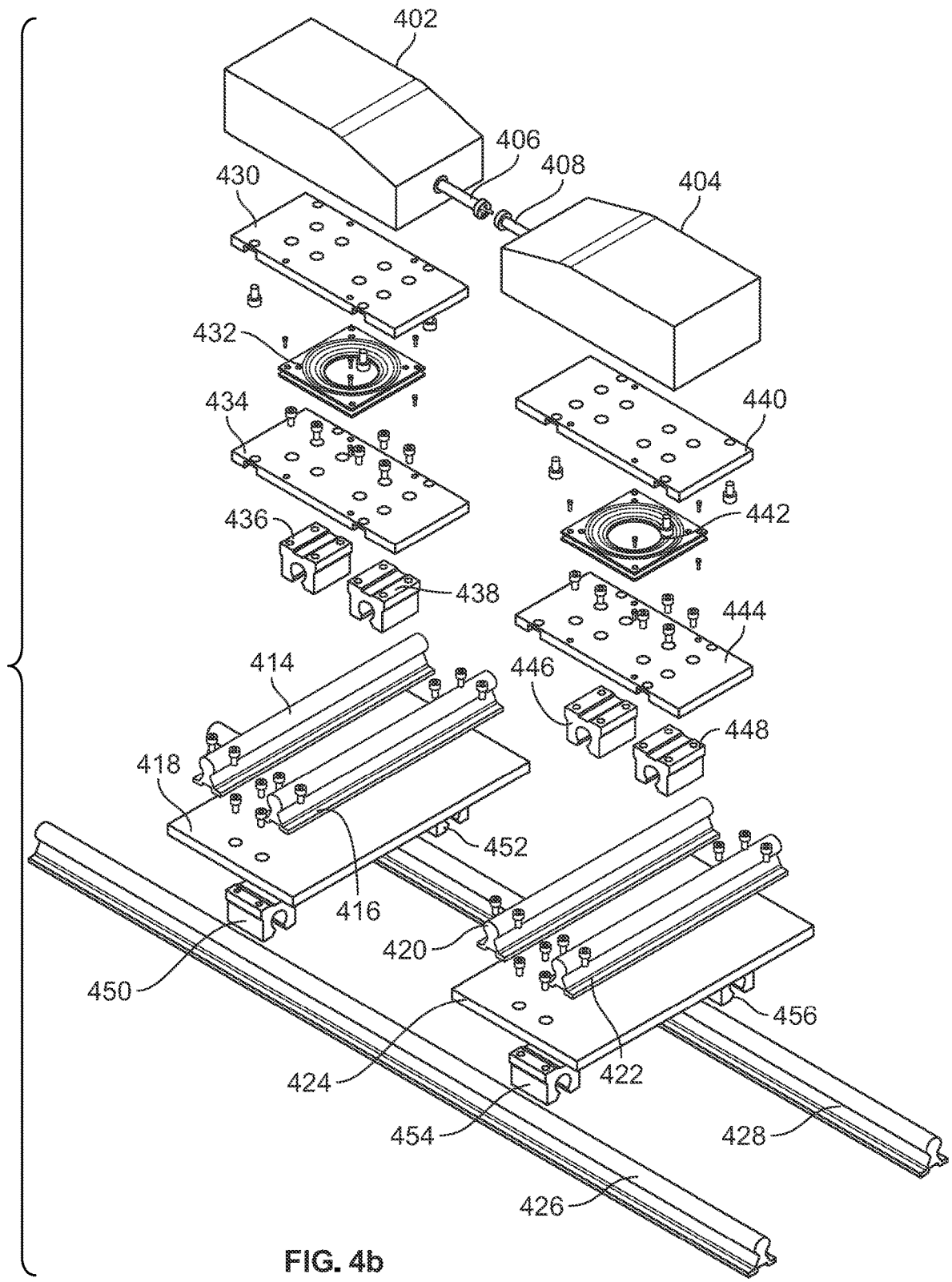

FIGS. 4a-4b are diagrams depicting various views of an embodiment of a system with multi-axis movement capability incorporating waveguide components configured for rapid high frequency testing. In system 400, as shown in FIG. 4a, waveguide components 406 and 408 are attached to VNA extenders 402 and 404, respectively. In some embodiments, waveguide component 406 and/or waveguide component 408 is waveguide component 104 of FIG. 1. In some embodiments, waveguide component 406 and/or waveguide component 408 is waveguide component 200 of FIG. 2a. In various embodiments, a DUT is placed between waveguide components 406 and 408. In some embodiments, the DUT is device under test 102 of FIG. 1. In various embodiments, the DUT does not need to be in physical contact with any part of the components shown in FIG. 4a. This is because waveguide components 406 and 408 can be have good electrical contact with the DUT without being in physical contact. The DUT may be held in an apparatus (not shown) (e.g., suspended in between waveguide components 406 and 408) so that the DUT can be swapped in and held and waveguide components 406 and 408 are able to be slid against the DUT. In some embodiments, the DUT is held up by alignment pins of waveguide components 406 and 408.

In the example shown, VNA extenders 402 and 404 are attached to VNA mounting apparatuses 410 and 412 respectively. System 400 differs from system 300 of FIGS. 3a-3d in that system 400 has multi-axis movement capability. VNA mounting apparatus 410 moves along tracks 414 and 416, which are attached to lower mounting plate 418. Similarly, VNA mounting apparatus 412 moves along track 420 and 422, which are attached to lower mounting plate 424. Thus, the two VNA extenders are able to independently move horizontally. They can also rotate (see FIG. 4b, in which the sub-components of VNA mounting apparatuses 410 and 412 are shown). Lower mounting plates 418 and 424 move along tracks 426 and 428. Thus, the two VNA extenders are also able to move vertically. Stated alternatively, utilizing the various tracks shown (two sets of tracks), VNA extenders 402 and 404 are able to move independently of each other along two orthogonal axes, and, utilizing a rotation mechanism shown in FIG. 4b, VNA extenders 402 and 404 are also able to move independently of each other around a third orthogonal axis. In total, the VNA extenders are able to move independently in three different directions. This freedom of movement allows for various measurement positions for a DUT placed between waveguide components 406 and 408.

FIG. 4b shows an exploded view of system 400. In the example illustrated, VNA extenders 402 and 404, waveguide components 406 and 408, tracks 414, 416, 420, and 422, lower mounting plates 418 and 424, and tracks 426 and 428 are the same as shown in FIG. 4a. In FIG. 4b, it can be seen that VNA mounting apparatus 410 is comprised of plate 430 to which VNA extender 402 and turntable 432 are fastened, plate 434 to which turntable 432 and sliders 436 and 438 are fastened, and turntable 432 positioned in between plates 430 and 434. Plate 430 is able to rotate with respect to plate 434 (plate 434 remains stationary) using turntable 432. In some embodiments, turntable 432 comprises upper and lower components that rotate with respect to each other. These upper and lower components may be coupled to each other and slide along a set of bearings. Plate 434 moves along tracks 414 and 416 via sliders 436 and 438. Analogously, VNA mounting apparatus 412 is comprised of plate 440 to which VNA extender 404 and turntable 442 are fastened, plate 444 to which turntable 442 and sliders 446 and 448 are fastened, and turntable 442 positioned in between plates 440 and 444. Plate 440 is able to rotate with respect to plate 444 (plate 444 remains stationary) using turntable 442. In various embodiments, turntable 442 employs the same rotation mechanism as turntable 432. Plate 444 moves along tracks 420 and 422 via sliders 446 and 448. In the example shown, lower mounting plate 418 is fastened to sliders 450 and 452 and moves along tracks 426 and 428 via sliders 450 and 452. In the example shown, lower mounting plate 424 is fastened to sliders 454 and 456 and moves along tracks 426 and 428 via sliders 454 and 456. In the example shown, various components are fastened to one another via screws.

Figure 5A:
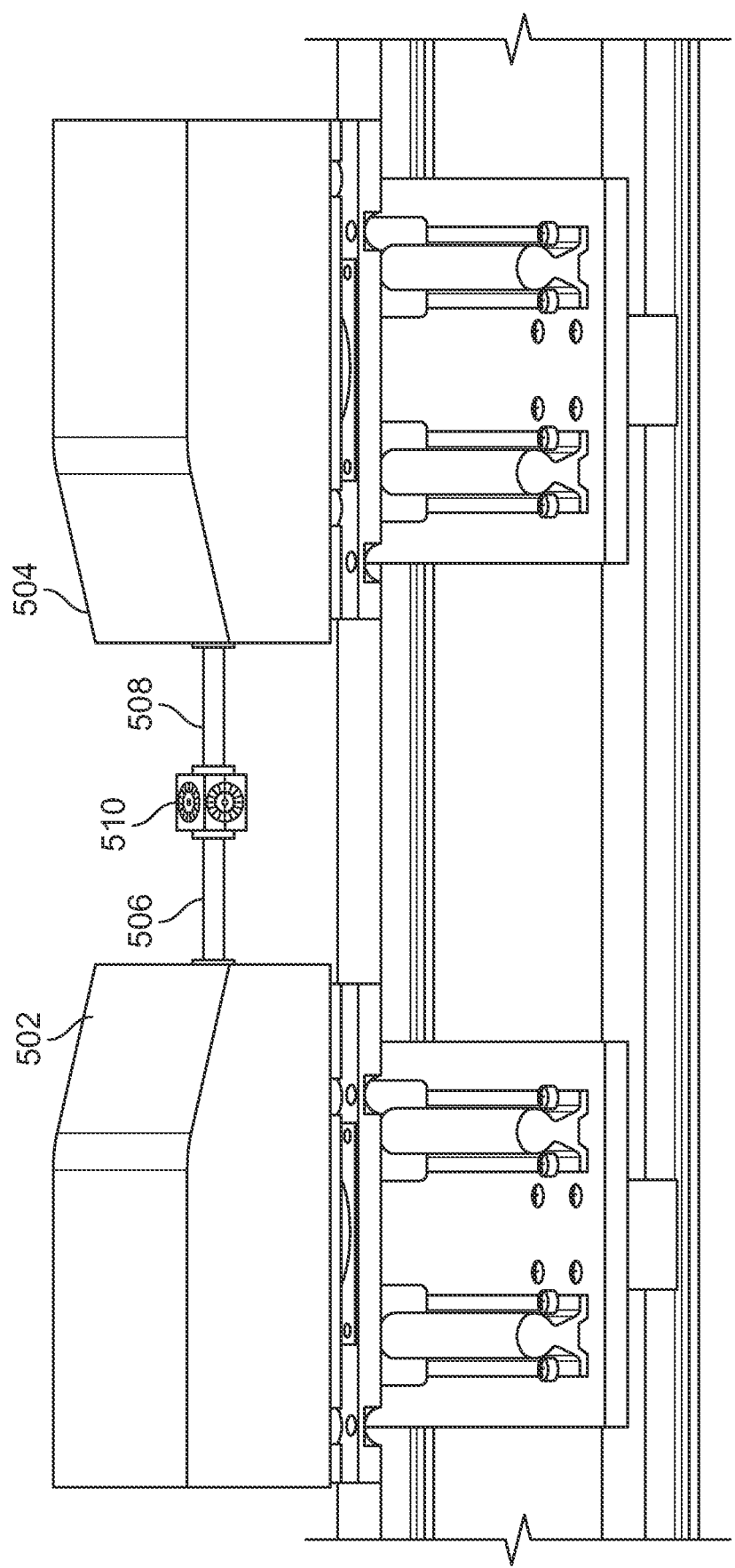
FIGS. 5a-5c are diagrams depicting various measurement positions utilizing an embodiment of a high frequency testing system with multi-axis movement capability.
Figure 5B:
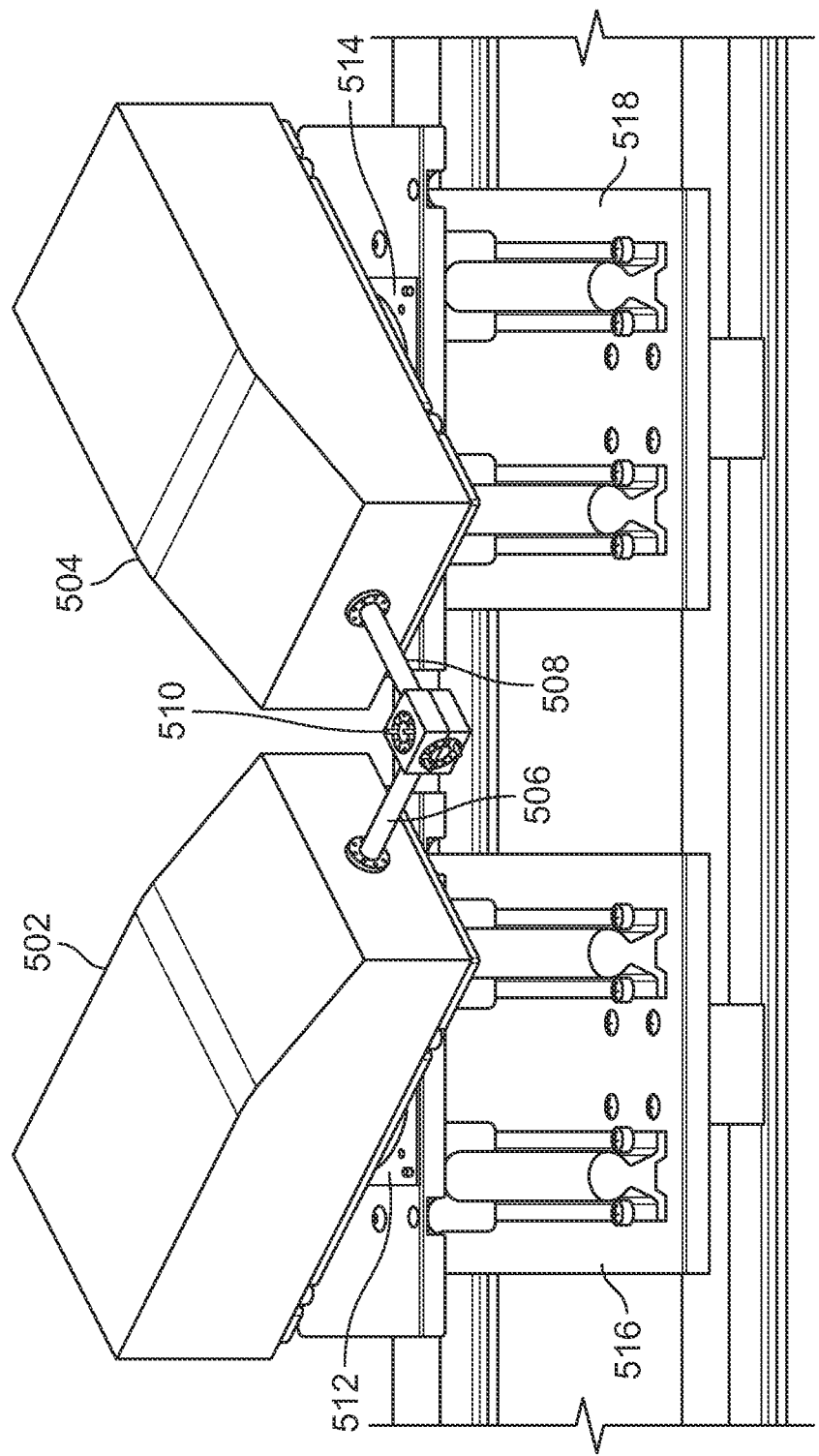
Figure 5C:
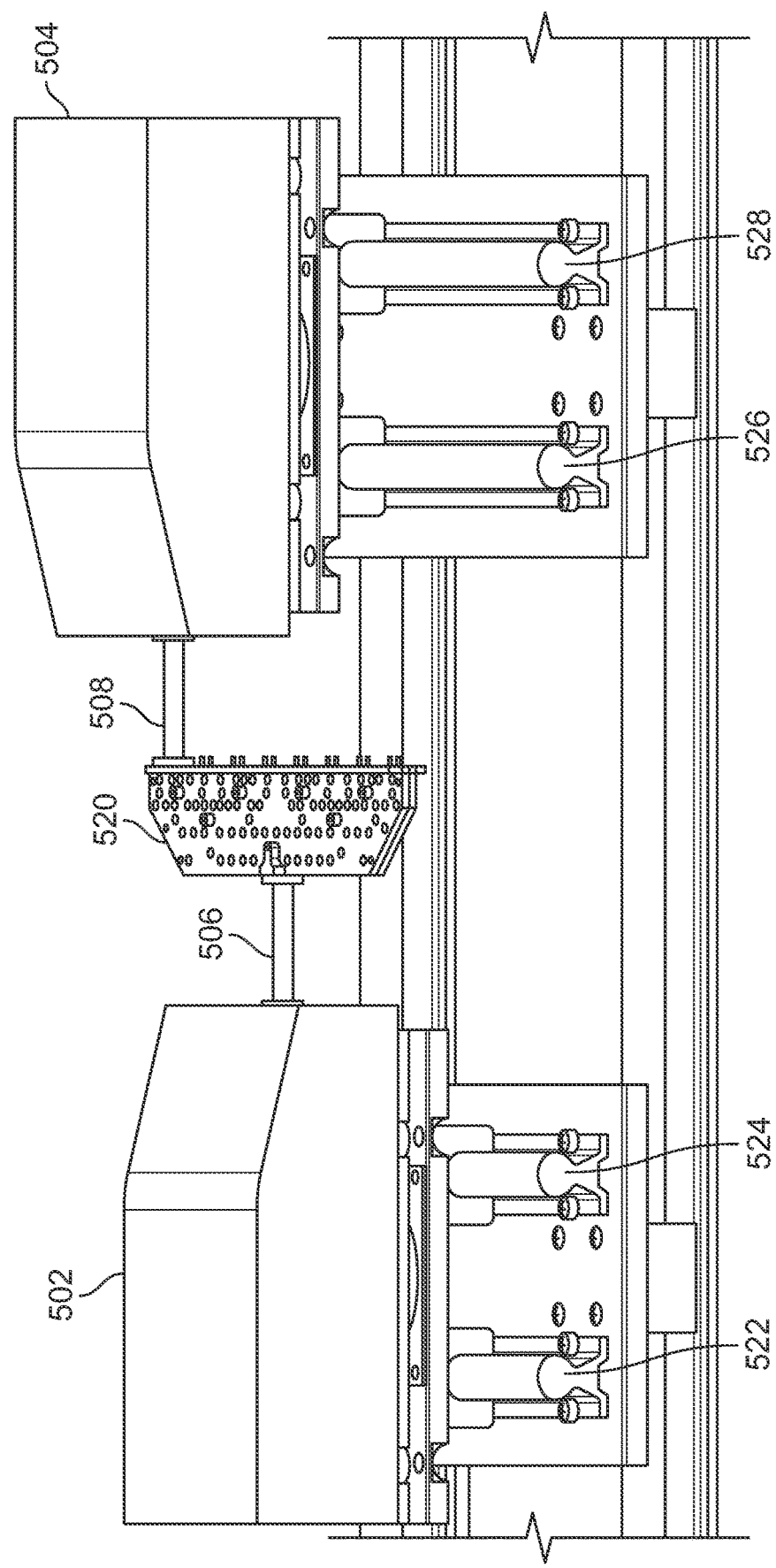

FIGS. 5a-5c are diagrams depicting various measurement positions utilizing an embodiment of a high frequency testing system with multi-axis movement capability. In some embodiments, system 400 of FIG. 4a-4b is utilized in the various measurement positions shown. For example, in some embodiments, VNA extenders 502 and 504 are VNA extenders 402 and 404 of FIGS. 4a-4b, respectively, and waveguide components 506 and 508 are waveguide components 406 and 408 of FIGS. 4a-4b, respectively. As illustrated, system 400 of FIGS. 4a-4b is depicted measuring DUT 510. For purposes of clarity, only some of the various components in FIGS. 5a-5c that correspond to system 400 of FIGS. 4a-4b are specifically labelled. FIG. 5a depicts inline testing of DUT 510. In this measurement position, waveguide components 506 and 508 are coupled to DUT 510 on opposing faces of DUT 510 such waveguide components 506 and 508 and DUT 510 form a line.

FIG. 5b depicts angular testing of DUT 510. In this measurement position, waveguide components 506 and 508 are coupled to DUT 510 on adjacent faces of DUT 510. Angular testing is possible because turntables 512 and 514 allow VNA extenders 502 and 504, respectively, to rotate in the plane parallel to the various plates shown (e.g., mounting plates 516 and 518). In some embodiments, turntables 512 and 514 are turntables 432 and 442, respectively, of FIG. 4b. In some embodiments, mounting plates 516 and 518 are lower mounting plates 418 and 424, respectively, of FIGS. 4a-4b.

FIG. 5c depicts offset testing of DUT 520. DUT 520 has a different shape than DUT 510. In the example illustrated, waveguide components 506 and 508 are coupled to DUT 520 in an offset arrangement. Specifically, in this example, waveguide component 506 is coupled to the center of DUT 520 but waveguide component 508 is coupled close to an outer edge of DUT 520 (offset with respect to where waveguide component 506 is coupled to DUT 520). Offset testing is possible because tracks 522 and 524 allow VNA extender 502 to move in a direction perpendicular to the long axis of waveguide component 506 and tracks 526 and 528 allow VNA extender 504 to move in a direction perpendicular to the long axis of waveguide component 508. In some embodiments, tracks 522 and 524 are tracks 414 and 416, respectively, of FIGS. 4a-4b. In some embodiments, tracks 526 and 528 are tracks 420 and 422, respectively, of FIGS. 4a-4b.

Figure 6A:
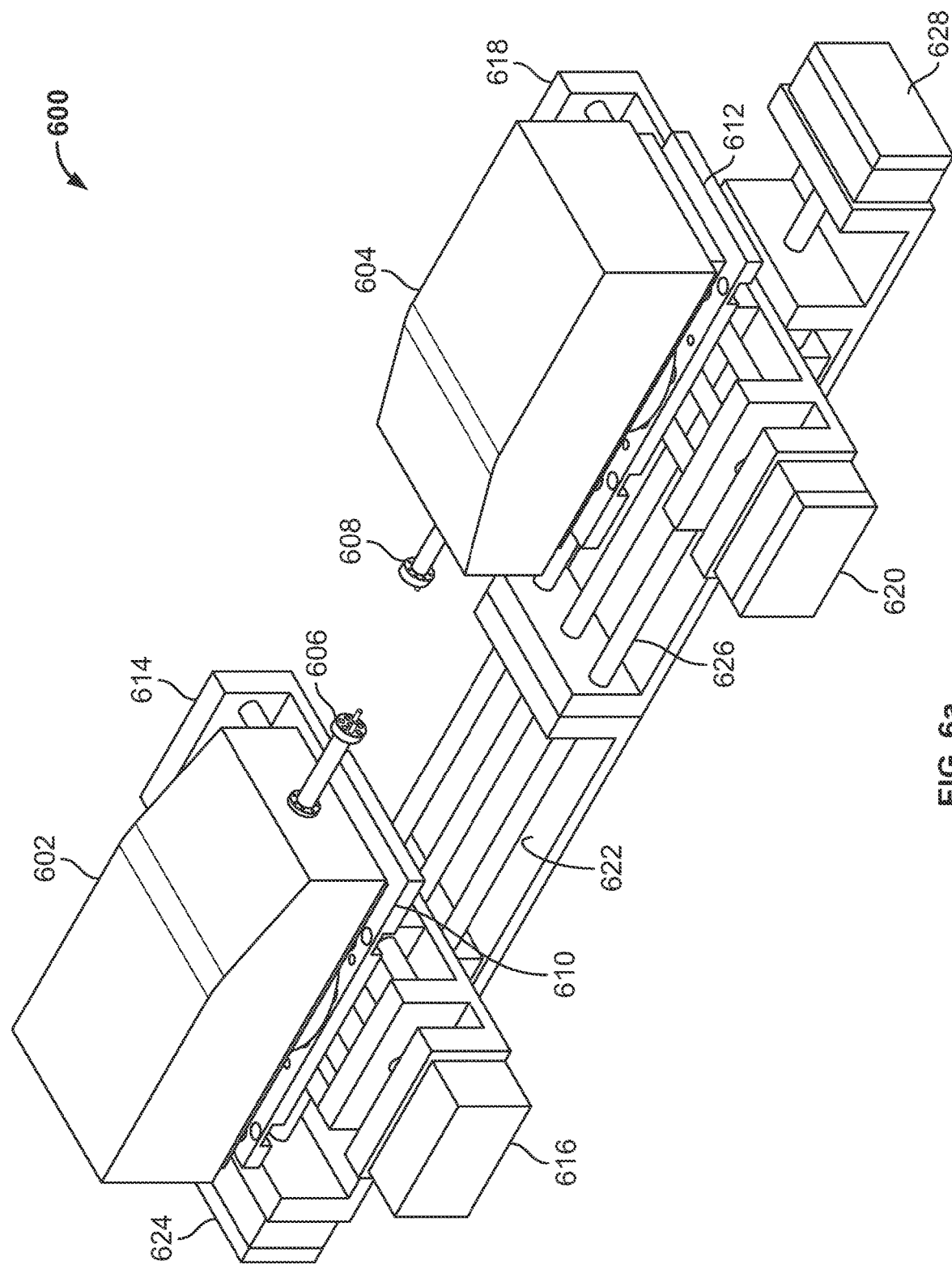
FIGS. 6a-6b are diagrams depicting various views of an embodiment of a system with motorized multi-axis movement capability incorporating waveguide components configured for rapid high frequency testing.
Figure 6B:
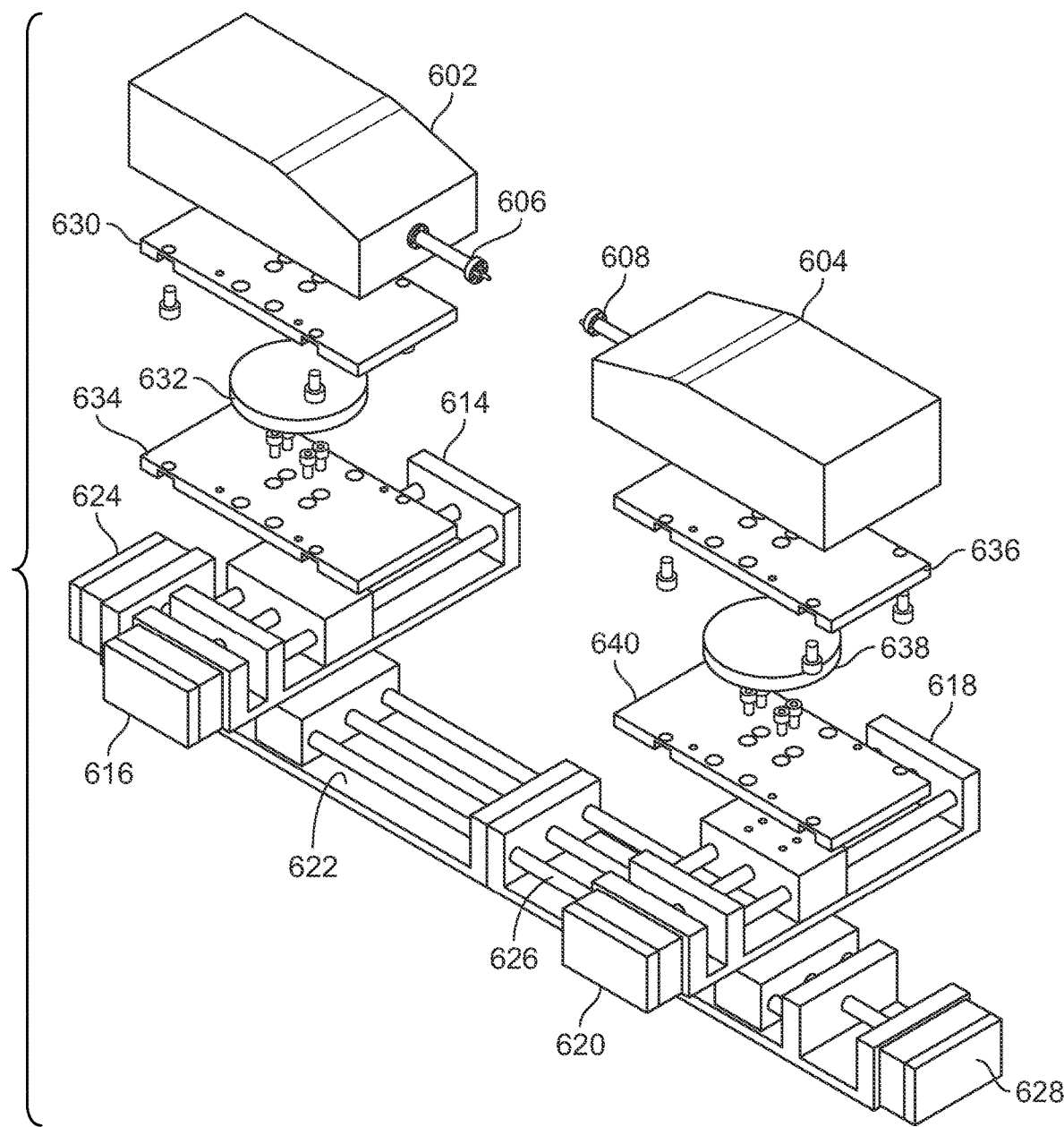

FIGS. 6a-6b are diagrams depicting various views of an embodiment of a system with motorized multi-axis movement capability incorporating waveguide components configured for rapid high frequency testing. In system 600, as shown in FIG. 6a, waveguide components 606 and 608 are attached to VNA extenders 602 and 604, respectively. In some embodiments, waveguide component 606 and/or waveguide component 608 is waveguide component 104 of FIG. 1. In some embodiments, waveguide component 606 and/or waveguide component 608 is waveguide component 200 of FIG. 2a. In various embodiments, a DUT is placed between waveguide components 606 and 608. In some embodiments, the DUT is device under test 102 of FIG. 1. In various embodiments, the DUT does not need to be in physical contact with any part of the components shown in FIG. 6a. This is because waveguide components 606 and 608 can have good electrical contact with the DUT without being in physical contact. The DUT may be held in an apparatus (not shown) (e.g., suspended in between waveguide components 606 and 608) so that the DUT can be swapped in and held and waveguide components 606 and 608 are able to be slid against the DUT. In some embodiments, the DUT is held up by alignment pins of waveguide components 606 and 608.

System 600 is similar to system 400 of FIGS. 4a-4b in that each VNA extender and corresponding attached waveguide component can move along two orthogonal axes and rotate about a third orthogonal axis. System 600 includes motorized movement. In various embodiments, the motorized movement is controlled by a computer or other programmable system. In various embodiments, system 600 includes actuators and computer control to allow for automated testing of DUTs. In the example illustrated, VNA extenders 602 and 604 are attached to VNA mounting apparatuses 610 and 612 respectively. As shown in FIG. 6b, VNA mounting apparatuses 610 and 612 include motorized turntables that allow for rotational movement. VNA extender 602 and VNA mounting apparatus 610 move along rail component 614 under the power of motor 616, which pushes and pulls VNA extender 602 and VNA mounting apparatus 610 along a first axis of movement. Rail component 614 and motor 616 are attached to rail component 622, which, under the power of motor 624, pushes and pulls rail component 614 and motor 616 along a second axis of movement that is orthogonal to the first axis of movement. The rotational movement afforded by VNA mounting apparatus 610 is around an axis orthogonal to the first two axes (e.g., translational movement about x and y axes and rotation about the z-axis in an x-y-z coordinate system). Analogously, VNA extender 604 and VNA mounting apparatus 612 move along rail component 618 under the power of motor 620, which pushes and pulls VNA extender 604 and VNA mounting apparatus 612 along the first axis of movement. Rail component 618 and motor 620 are attached to rail component 626, which, under the power of motor 628, pushes and pulls rail component 618 and motor 620 along the second axis of movement. Rotational movement afforded by VNA mounting apparatus 612 is around the axis orthogonal to the first two axes. In some embodiments, a robotic arm (not shown) moves a DUT into space between waveguide components 606 and 608, automated rail movements slide VNA extenders 602 and 604 (with waveguide components 606 and 608, respectively) into place to couple to the DUT, testing of the DUT occurs, automated rail movements slide VNA extenders 602 and 604 (with waveguide components 606 and 608, respectively) away from the DUT, and the robotic arm removes the DUT. This process can then be repeated for another DUT. Doing so allows for rapid, high-throughput testing of DUTs.

FIG. 6b shows an exploded view of system 600. VNA extenders 602 and 604, waveguide components 606 and 608, rail components 614, 618, 622, and 626, and motors 616, 620, 624, and 628 are the same as shown in FIG. 6a. In FIG. 6b, it can be seen that VNA mounting apparatus 610 is comprised of upper plate 630 to which VNA extender 602 and motor-controlled turntable 632 are fastened, lower plate 634 to which motor-controlled turntable 632 and rail component 614 are fastened, and motor-controlled turntable 632 positioned in between upper plate 630 and lower plate 634. Motor-controlled turntable 632 causes upper plate 630 to rotate with respect to lower plate 634. In various embodiments, the motorized movement of turntable 632 is controlled by a computer or other programmable system. Analogously, VNA mounting apparatus 612 is comprised of upper plate 636 to which VNA extender 604 and motor-controlled turntable 638 are fastened, lower plate 640 to which motor-controlled turntable 638 and rail component 618 are fastened, and motor-controlled turntable 638 positioned in between upper plate 636 and lower plate 640. Motor-controlled turntable 638 causes upper plate 636 to rotate with respect to lower plate 640. In various embodiments, the motorized movement of turntable 638 is controlled by a computer or other programmable system. In the example shown, movement along the rail components is in the form of blocks sliding along cylindrical rods that pass through the blocks. Components that move are fastened to the sliding blocks. In the example shown, various components are fastened to one another via screws.

Figure 7:
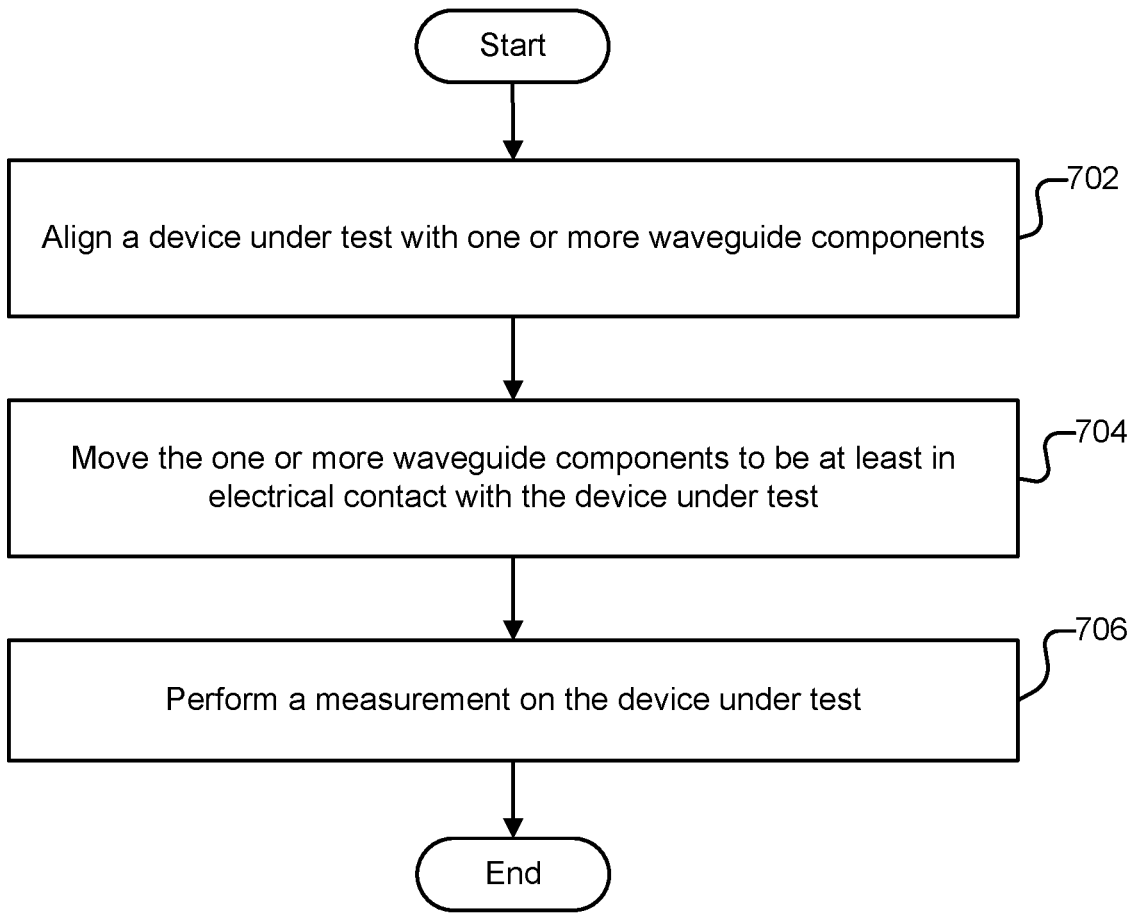
FIG. 7 is a flow chart illustrating an embodiment of a process for performing measurements on a device.

FIG. 7 is a flow chart illustrating an embodiment of a process for performing measurements on a device. In some embodiments, the process of FIG. 7 is performed by testing equipment 106 of FIG. 1. In some embodiments, the process of FIG. 7 is performed by system 300 of FIGS. 3a-3d. In some embodiments, the process of FIG. 7 is performed by system 400 of FIGS. 4a-4b. In some embodiments, the process of FIG. 7 is performed by system 600 of FIGS. 6a-6b.

At 702, a device under test is aligned with one or more waveguide components. In some embodiments, the device under test is device under test 102 of FIG. 1. In various embodiments, the device under test is aligned with two waveguide components. In some embodiments, at least one of the waveguide components is waveguide component 104 of FIG. 1. In some embodiments, at least one of the waveguide components is waveguide component 200 of FIG. 2a. In various embodiments, aligning the device under test includes positioning the device under test in between the waveguide components. In some embodiments, a robotic arm places the device under test between the waveguide components. It is also possible to manually place the device under test. In some embodiments, aligning the device under test is an automated process controlled by a computer or other programmable system.

At 704, the one or more waveguide components are moved to be at least in electrical contact with the device under test. In various embodiments, the waveguide components need not be in physical contact with the device under test in order to be in good electrical contact. For example, waveguide component 200 of FIG. 2a can operate in a contactless mode. In various embodiments, the waveguide components are moved to be approximately in physical contact with the device under test. In many scenarios, physical contact may be momentary and a small gap of space develops between the device under test and each waveguide component after moving the waveguide components into position with the device under test. As described above, the small gap does not affect testing performance under prescribed conditions (e.g., the gap distance is less than $$\frac{\lambda_0}{4},$$

where $\lambda_0$ is the wavelength of the operating frequency in air). In some embodiments, the waveguide components are moved into position with the device under test manually (e.g., with system 300 of FIGS. 3a-3d or system 400 of FIGS. 4a-4b). In some embodiments, the waveguide components are moved into position automatically (e.g., with system 600 of FIGS. 6a-6b) under computer guidance. The waveguide components may be moved into a measuring position in which the waveguide components and the device under test form a line (e.g., an inline testing position as shown in FIG. 5a). The waveguide components may also be moved into a measurement position in which the waveguide components form an angle (e.g., a 90-degree angle) with the device under test (e.g., an angular testing position as shown in FIG. 5b). Other measurement positions are also possible. For example, the waveguide components may be moved into a measurement position in which the waveguide components are not in line with each other but still parallel to each other (e.g., an offset testing position as shown in FIG. 5c). Various other testing positions are also realizable with multi-axis movement capability (e.g., with system 400 of FIGS. 4a-4b or system 600 of FIGS. 6a-6b).

At 706, a measurement is performed on the device under test. In various embodiments, performing a measure includes utilizing testing equipment to transmit to and receive signals from the device under test. The measurement is oftentimes associated with a device gain and/or loss at a specified frequency or as a function of frequency. Examples of properties that may be measured include S-parameters, Y-parameters, Z-parameters, H-parameters, various types of gains/losses associated with microwave frequency and other devices, and so forth.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A waveguide interface, comprising:
   an inner boundary region extending peripherally around a cavity;
   a recessed region extending peripherally around the inner boundary region;
   a plurality of protrusions extending from the recessed region; and
   an outer boundary region extending peripherally around the recessed region,
   wherein:
      the inner boundary region, the outer boundary region, and the plurality of protrusions are substantially level with one another;
      the plurality of protrusions comprise an inner ring of a first set of protrusions configured peripherally around the inner boundary region, and an outer ring of a second set of protrusions configured peripherally around the first set of protrusions;
      the first set of protrusions have a different size than the second set of protrusions; and
      the waveguide interface is configured to function as a waveguide at a predefined distance from a device under test without coupling or fastening the waveguide interface to the device under test.

2. The waveguide interface of claim 1, wherein the plurality of protrusions is arranged concentrically within the recessed region.

3. The waveguide interface of claim 1, further comprising at least one hole configured to receive a fastener.

4. The waveguide interface of claim 1, further comprising at least one hole configured to receive an alignment pin.

5. The waveguide interface of claim 1, wherein the recessed region has a depth that is a quarter of a wavelength of electromagnetic waves guided through the cavity at a frequency at which the waveguide interface is configured to operate.

6. The waveguide interface of claim 1, wherein a protrusion of the plurality of protrusions is shaped like a rectangular column.

7. The waveguide interface of claim 1, wherein the plurality of protrusions is arranged as a first ring of protrusions surrounding the inner boundary region and a second ring of protrusions surrounding the first ring of protrusions.

8. The waveguide interface of claim 1, wherein at least a part of the inner boundary region has a thickness extending radially outward from the cavity to the recessed region of a quarter of a wavelength of electromagnetic waves guided through the cavity at a frequency at which the waveguide interface is configured to operate.

9. The waveguide interface of claim 1, wherein the cavity, the inner boundary region, and the plurality of protrusions are substantially level with one another.

10. The waveguide interface of claim 1, wherein an offset with respect between two of the inner boundary region, the outer boundary region, and the plurality of protrusions is less than 20% of a height of a first protrusion of the plurality of protrusions.

11. The waveguide interface of claim 1, wherein an offset between a first protrusion of the plurality of protrusions and one or more of the inner boundary region and the outer boundary region is less than $\lambda 0/4$, and $\lambda 0$ corresponds to a wavelength of an operating frequency in air.

12. The waveguide interface of claim 1, wherein a device under test is positioned between a first waveguide component and a second waveguide component, and the first waveguide component and the second waveguide component respectively comprise the waveguide interface.

13. The waveguide interface of claim 1, wherein the waveguide interface is gold-plated or comprises brass.

14. The waveguide interface of claim 1, wherein:
the plurality of protrusions comprises protrusions having a width less than $\lambda_0/8$ and a pitch between protrusions of less than $\lambda_0/4$; and
$\lambda_0$ corresponds to a wavelength of an operating frequency in air.

15. The waveguide interface of claim 1, wherein the plurality of protrusions comprises five rings of protrusions around the inner boundary region.

16. The system of claim 15, further comprising an additional set of one or more tracks configured to guide the electronic testing equipment along a second linear direction orthogonal to the first linear direction.

17. The system of claim 15, wherein movement of the electronic testing equipment along the first linear direction is actualized by a motor.

18. The system of claim 15, wherein movement of the electronic testing equipment along the first linear direction is at least in part controlled by a computer.

19. The system of claim 15, further comprising a turntable coupled to the electronic testing equipment that is configured to allow the electronic testing equipment to rotate about an axis orthogonal to the first linear direction.

20. The waveguide interface of claim 1, further comprising:
an anti-cocking ring extending peripherally around the outer boundary region,
wherein:
the anti-cocking ring comprises a set of holes recessed from a surface of the outer boundary region; and
the set of holes configured to receive one or more of alignment pins and fasteners.

21. A system, comprising:
a waveguide component that includes a first end, wherein the first end includes an interface configured to electrically couple to a device undergoing electronic testing; and
a set of one or more tracks configured to couple to an electronic testing equipment that is configured to couple to a second end of the waveguide component;
wherein:
the interface comprises:
an inner boundary region extending peripherally around a cavity;
a recessed region extending peripherally around the inner boundary region;
a plurality of protrusions extending from the recessed region; and
an outer boundary region extending peripherally around the recessed region;
the inner boundary, the outer boundary region, and the plurality of protrusions are substantially level with one another;
the plurality of protrusions comprise an inner ring of a first set of protrusions configured peripherally around the inner boundary region, and an outer ring of a second set of protrusions configured peripherally around the first set of protrusions;
the first set of protrusions have a different size than the second set of protrusions; and
the waveguide interface is configured to function as a waveguide at a predefined distance from a device under test without coupling or fastening the waveguide interface to the device under test.

22. The system of claim 21, wherein the device undergoing testing is positioned a distance from the interface at the first end of the waveguide component that is less than a quarter of a wavelength of electromagnetic waves travelling in air at a frequency at which the waveguide interface is configured to operate but is not in physical contact with the waveguide interface.

23. The system of claim 21, wherein the electronic testing equipment is an extension component of a network analyzer.

24. The system of claim 21, wherein the set of one or more tracks is configured to guide the electronic testing equipment along a first linear direction.

25. A method, comprising:
aligning a device under test with a waveguide interface of a waveguide component, wherein the waveguide interface includes an inner boundary region extending peripherally around a cavity, a recessed region extending peripherally around the inner boundary region, a plurality of protrusions extending from the recessed region, and an outer boundary region extending peripherally around the recessed region; and
causing electromagnetic waves to be transmitted from an electronic testing equipment through the waveguide component to the device under test,
wherein:
the inner boundary, the outer boundary region, and the plurality of protrusions are substantially level with one another;
the plurality of protrusions comprise an inner ring of a first set of protrusions configured peripherally around the inner boundary region, and an outer ring of a second set of protrusions configured peripherally around the first set of protrusions;
the first set of protrusions have a different size than the second set of protrusions; and
the waveguide interface is configured to function as a waveguide at a predefined distance from a device under test without coupling or fastening the waveguide interface to the device under test.

\* \* \* \* \*